(12) United States Patent
Chen et al.

(10) Patent No.: US 9,082,656 B2
(45) Date of Patent: Jul. 14, 2015

(54) NAND FLASH WITH NON-TRAPPING SWITCH TRANSISTORS

(75) Inventors: Shih-Hung Chen, Hsinchu (TW); Hang-Ting Lue, Hsinchu (TW); Yen-Hao Shih, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 620 days.

(21) Appl. No.: 13/294,852

(22) Filed: Nov. 11, 2011

(65) Prior Publication Data

US 2013/0119455 A1    May 16, 2013

(51) Int. Cl.
    *H01L 27/115*    (2006.01)
(52) U.S. Cl.
    CPC ...... *H01L 27/1157* (2013.01); *H01L 27/11578* (2013.01)
(58) Field of Classification Search
    CPC ................ H01L 27/11578; H01L 27/1157
    See application file for complete search history.

(56) References Cited

U.S. PATENT DOCUMENTS

| | | | |
|---|---|---|---|
| 6,034,882 A | 3/2000 | Johnson et al. | |
| 6,906,361 B2 | 6/2005 | Zhang | |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,851,849 B2 | 12/2010 | Kiyotoshi | |
| 2005/0280061 A1 | 12/2005 | Lee | |
| 2006/0202262 A1 | 9/2006 | Lee | |
| 2006/0292781 A1* | 12/2006 | Lee .............................. 438/197 |
| 2007/0140001 A1 | 6/2007 | Motoi et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Lue, H-T. et al., "A Highly Scalable 8-Layer 3D Vertical-Gate (VG) TFT NAND Flash Using Junction-Free Buried Channel BE-SONOS Device," 2010 Symp. on VLSI Technology, Digest of Technical Papers, pp. 131-132.

(Continued)

*Primary Examiner* — Daniel Luke
(74) *Attorney, Agent, or Firm* — Yiding Wu; Haynes Beffel & Wolfeld LLP

(57) ABSTRACT

A manufacturing method for a memory array includes first forming a multilayer stack of dielectric material on a plurality of semiconductor strips, and then exposing the multilayer stack in switch transistor regions. The multilayer stacks exposed in the switch transistor regions are processed to form gate dielectric structures that are different than the dielectric charge trapping structures. Word lines and select lines are then formed. A 3D array of dielectric charge trapping memory cells includes stacks of NAND strings of memory cells. A plurality of switch transistors are coupled to the NAND strings, the switch transistors including gate dielectric structures wherein the gate dielectric structures are different than the dielectric charge trapping structures.

7 Claims, 20 Drawing Sheets

(56) References Cited

U.S. PATENT DOCUMENTS

| | | | |
|---|---|---|---|
| 2008/0180994 A1 | 7/2008 | Katsumata et al. | |
| 2008/0247230 A1 | 10/2008 | Lee et al. | |
| 2009/0097321 A1 | 4/2009 | Kim et al. | |
| 2009/0184360 A1 | 7/2009 | Jin et al. | |
| 2009/0309154 A1 | 12/2009 | Cho et al. | |
| 2010/0226195 A1* | 9/2010 | Lue | 365/230.06 |
| 2010/0270593 A1 | 10/2010 | Lung et al. | |
| 2012/0068241 A1* | 3/2012 | Sakuma et al. | 257/314 |

OTHER PUBLICATIONS

Soon-Moon Jung et al. "Three Dimensionally Stacked NAND Flash Memory Technology Using Stacking Single Crystal Si Layers on ILD and TANOS Structure for Beyond 30nm Node," Electron Devices Meeting, 2006, IEDM International, Dec. 11-13, 2006, pp. 1-4.

Jiyoung Kim et al., Novel 3-D Structure for Ultra High Density Flash Memory with VRAT (Vertical-Recess-Array-Transistor) and PIPE (Planarized Integration on the same PlanE), 2008 Symposium on VLSI Technology Digest of Technical Papers, pp. 122-123.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) NAND-Type Flash Memory," 2006 IEEE, pp. 1-4.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-Channel FinFET BE-SONOS NAND Flash with Improved Memory Window and Cycling Endurance," 2009 Symposium on VLSI Technology Digest of Technical Papers, pp. 224-225.

Wonjoo Kim et al. "Multi-Layered Vertical Gate NAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-$Al_2O_3$ Bandgap Engineered SONOS) Using a $SiO_2$ Buffer Layer," VLSI Technology, Systems and Applications 2008, VLSI-TSA International Symposium on Apr. 21-23, 2008, pp. 58-59.

Yoshiaki Fukuzumi et al. "Optimal Integration and Characteristics of Vertical Array Devices for Ultra-High Density, Bit-Cost Scalable Flash Memory," IEEE 2007, pp. 449-452.

Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

* cited by examiner

Fig. 3 - PRIOR ART

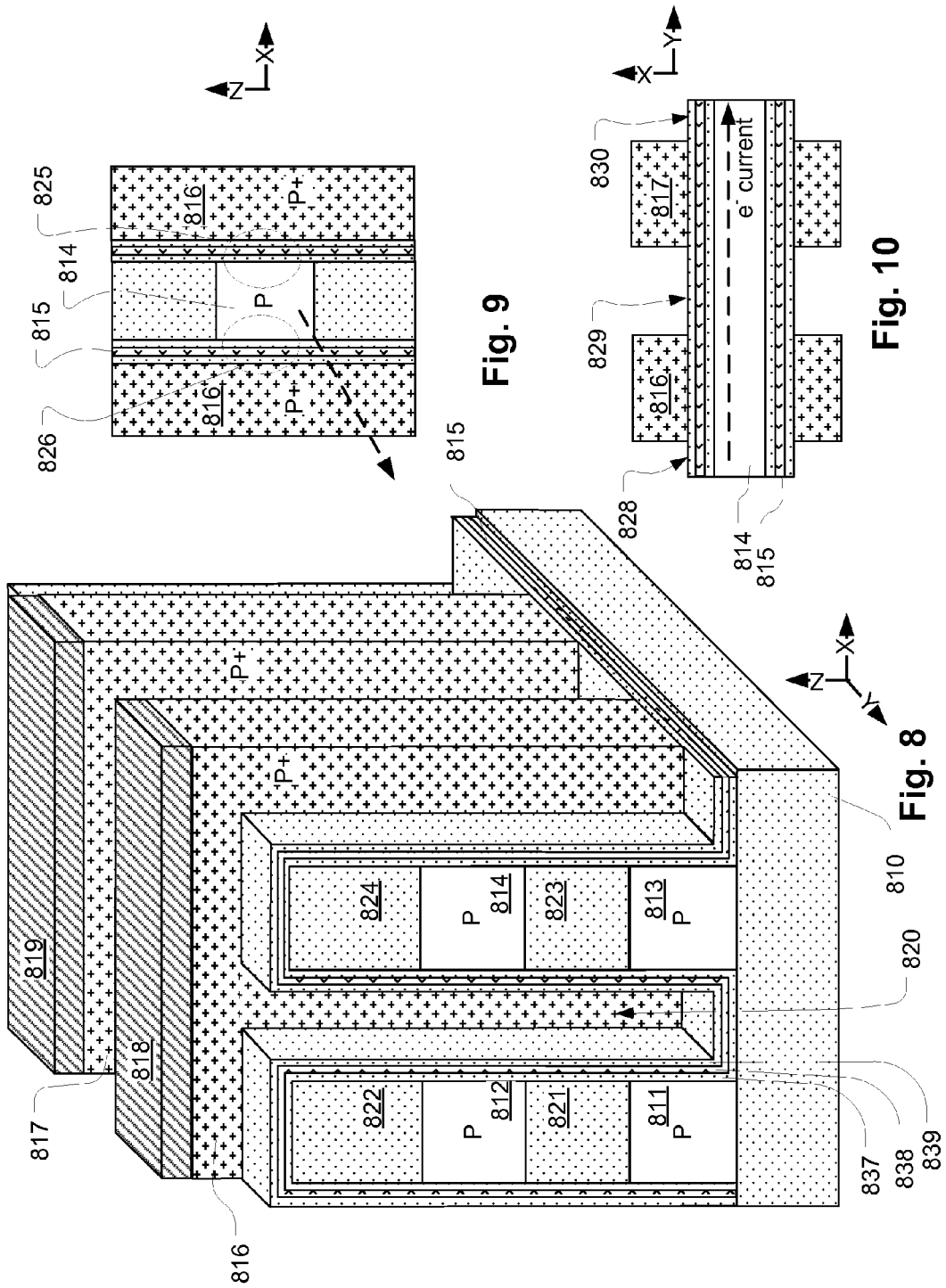

NAND FLASH WITH NON-TRAPPING SWITCH TRANSISTORS

BACKGROUND

1. Field

The present invention relates to flash memory technology.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping structure in place of the floating gate. Charge trapping memory cells use dielectric material for charge storage that does not cause cell-to-cell interference like that encountered with floating gate technology.

The typical charge trapping flash memory cell consists of a field effect transistor FET structure having a source and drain separated by a channel, and a gate separated from the channel by a charge storage structure including a tunnel dielectric layer, the dielectric charge storage layer, and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the memory cells are arranged in NAND strings that comprise a series of memory cells having switch transistors used to connect the strings to, for example, bit lines and common source lines. The switch transistors are commonly called string select transistors and ground select transistors, and can consist of an FET transistor in series with the string of memory cells, having its gate in a corresponding string select line SSL or ground select line GSL arranged in parallel with the word lines for the memory array. Switch transistors can be used in other types of architectures as well, and used for selecting blocks of memory cells.

In high density charge trapping memory cells including three-dimensional arrays, switch transistors have been implemented using FETs having the same structure as the memory cells, albeit sometimes having wider channels or other modifications. Thus, these switch transistors have charge trapping structures in the gate dielectric. During manufacturing of a charge trapping memory device of this type, charge can accumulate in the gate dielectric of the switch transistors resulting in a wide distribution of switch transistor threshold across the device. This can impact device performance in a number of undesirable ways.

Accordingly, it is desirable to provide a new memory technology suitable for implementation of switch transistors in charge trapping memory devices, including devices arranged in a NAND architecture.

SUMMARY

A memory device is described that can comprise a three-dimensional 3D array of memory cells including dielectric charge trapping structures, having a plurality of switch transistors including gate dielectrics different than the dielectric charge trapping structures. The gate dielectrics include modified dielectric charge trapping structures in some examples, where the modifications reduce or eliminate the ability of the structure to trap charge.

A 3D NAND architecture array is described that includes surrounding gate switch transistors.

Manufacturing methods are described that can be applied form the gate dielectric structures in memory arrays as described herein, including 3D NAND architecture arrays.

Other aspects and advantages of the present invention can be seen on review of the drawings, the detailed description in the claims which follow.

BRIEF DESCRIPTION OF THE DRAWINGS

FIG. 8 is a perspective illustration of a 3D NAND flash memory structure including a plurality of planes of semiconductor strips parallel to a Y-axis, arranged in a plurality of ridge-shaped stacks, a charge trapping memory layer on side surfaces of the semiconductor strips, and a plurality of word lines with conformal bottom surfaces arranged over the plurality of ridge-shaped stacks.

FIG. 9 is a cross-section of a memory cell taken in the X-Z plane from the structure of FIG. 8.

FIG. 10 is a cross-section of a memory cell taken in the X-Y plane from the structure of FIG. 8.

DETAILED DESCRIPTION

A detailed description of embodiments of the present invention is provided with reference to the FIGS. 1-24.

Figure 1:
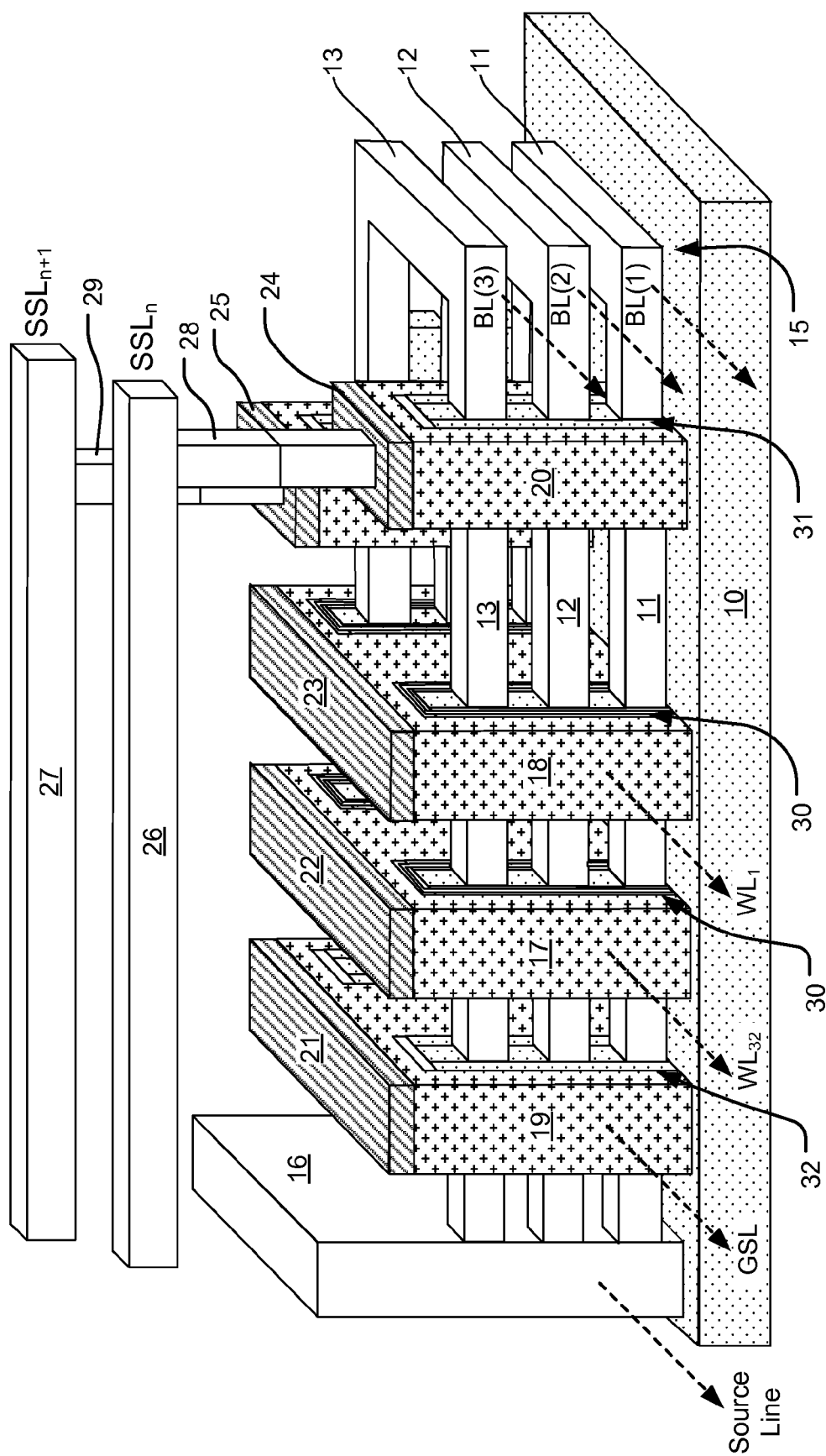
FIG. 1 is a perspective drawing of the basic structure of a three-dimensional NAND architecture charge trapping memory device.

FIG. 1 is a simplified view of a 3D memory having dielectric fill removed to reveal structures of the 3D memory, based on the memory described in our publication, Lue et al., "A Highly Scalable 8-Layer 3D Vertical-Gate (VG) TFT NAND Flash Using Junction-Free Buried Channel BE-SONOS Device," 2010 Symposium on VLSI Technology Digest of Technical Papers, pages 131-132 (Symposium held in June 2010). The structure shown in FIG. 1 comprises a 3D array of memory cells which have dielectric charge trapping structures 30 in a NAND architecture including stacks of NAND strings of memory cells. The structure includes a plurality of switch transistors coupled to the NAND string. The switch transistors include gate dielectrics 31 and 32 that are different than the dielectric charge trapping structures 30 in the memory cells.

The 3D array includes a plurality of the stacks of semiconductor strips (11, 12, 13) on a substrate 10. The semiconductor strips are arranged to provide the semiconductor body for series connected cells in the NAND strings. In this architecture, the semiconductor strips 11, 12, 13 in each level of a block of cells are connected in the region 15, forming bit line level structures BL(1), BL(2), BL(3) that can be used for decoding a level of memory cells. Not shown in the diagram is a contact structure connecting to the bit line level structures BL(1), BL(2), BL(3) to overlying global bit lines (not shown) which can be implemented in a patterned metal layer.

A plurality of word lines 17, 18 is arranged orthogonally over the plurality of stacks, such that a 3D array of interface regions is established at crosspoints between the surfaces of the semiconductor strips 11, 12, 13 in the plurality of stacks and the plurality of word lines. The word lines 17, 18 can be implemented using polysilicon which is conformally deposited over the stacks and patterned to define the word lines. A layer of silicide 22, 23, such as tungsten silicide, can be formed over the top of the patterned polysilicon. In the diagram, two word line structures are illustrated with the designations WL1 and WL32 indicating that in a typical NAND string, a larger number of word lines, such as 32, can be implemented. Dielectric charge trapping structure 30, such as an ONO or an ONONO multilayer, is disposed at the interface regions between the word lines and the semiconductor strips for the memory cells in the structure. The dielectric charge trapping structure 30 can be a blanket layer over the memory cells, or a patterned layer. In this arrangement, source/drain implants can be formed between the word lines, but such implants may not be used in some embodiments.

In this example, a ground select transistor (having a gate in the ground select line 19) is implemented on the first end of each NAND string and a string select transistor (having string select gate 20) is implemented on the second end of each NAND string. The ground select transistor is operated to couple the strips 11, 12, 13 to a source side bias structure provided in this example by common source line 16. The string select transistor is operated to couple the strips 11, 12, 13 to the contact areas in the region 15 for connection to drain side bias structures such as the overlying global bit lines mentioned above. In this example, a ground select line 19 is arranged orthogonally over the plurality of stacks parallel with the word lines 17, 18 and acts as the gate conductor for the ground select transistors, providing for connection of all the ridges in the block to the source side bias structure in response to a single signal. A layer of silicide 21 is formed over the ground select line 19.

Also, the string select gate 20 comprises an element that wraps over a single ridge at a time in this example. An independently addressable string select gate 20 is established for each column in the block. A layer 24, 25 of silicide can be formed on the tops of the string select gate 20. String select transistors are formed thereby at the end of each string in the ridge shaped stacks of semiconductors strips. The string select gate 20 is coupled via contact structures 28, 29 to overlying source select lines 26, 27, allowing individual selection of each ridge in the block.

The decoding structure allows for selection of an X-Z plane of memory cells using a word line (WL1-WL32), for selection of a X-Y plane of memory cells using a bit line level structure (BL(1), BL(2), etc.), and for selection of a Y-Z plane of memory cells using the string select lines (SSLn), whereby individual cells in selected NAND strings can be addressed.

The gate dielectric 32 for the ground select transistors is different than the dielectric charge trapping structure 30 used in the memory cells. Likewise, the gate dielectric 31 for the string select transistors is different than a dielectric charge trapping structure 30 used in the memory cells. The gate dielectrics 31, 32 can comprise a structure that is formed by modifying the dielectric charge trapping structure in the switch transistor regions so that they do not have the capacity or have a reduced capacity to trap charge.

Figure 2:
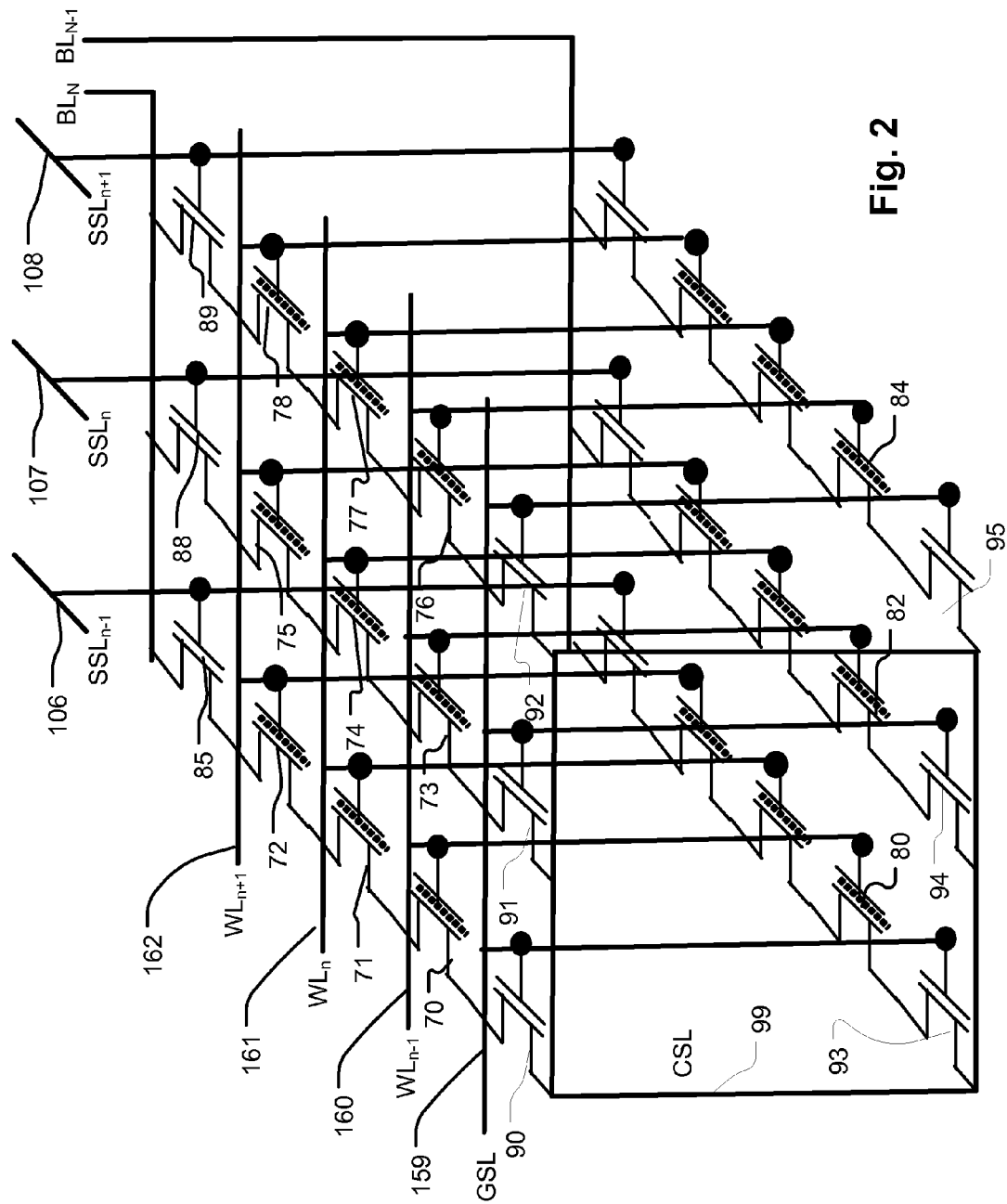
FIG. 2 is a simplified schematic diagram of a three-dimensional NAND architecture charge trapping memory device.

FIG. 2 is a schematic circuit diagram showing two memory planes having nine dielectric charge trapping cells each, arranged in a NAND configuration. The illustrated circuit is representative of a cube or block which can include many planes and many word lines. A circuit like that of FIG. 2 can be implemented as shown in FIG. 1, for example, and in a variety of other structures. The two planes of memory cells are accessed by word lines WLn−1, WLn, WLn+1.

The first plane of memory cells includes memory cells 70, 71, 72 in a NAND string on a semiconductor strip, memory cells 73, 74, 75 in a NAND string on a semiconductor strip, and memory cells 76, 77, 78 in a NAND string on a semiconductor strip. The second plane of memory cells corresponds with a bottom plane in the cube in this example, and includes memory cells (e.g. 80, 82, 84) arranged in NAND strings in a similar manner those in the first plane. Each NAND string is connected to a ground select transistor 90-95 on one end, and via the ground select transistors to a common source line CSL 99.

As shown in the figure, the word line 161 acting as word line WLn includes vertical extensions between the stacks, in order to couple the word line 161 to the memory cells (cells 71, 74, 77 in the first plane, cells 80, 82, 84 is the second plane) in the interface regions in the trenches between the semiconductor strips in all of the planes.

Memory cell strings in adjacent stacks can be arranged to alternate between a bit line end-to-source line end orientation and a source line end-to-bit line end orientation in other embodiments.

Bit line level structures and global bit lines $BL_N$ and $BL_{N-1}$ terminate the memory cell strings, adjacent to the string select devices. For example, in the top memory plane, bit line $BL_N$ terminates the memory cell strings which have string select transistors 85, 88 and 89.

String select transistors 85, 88, 89 are connected between respective NAND strings and string select lines $SSL_{n-1}$, $SSL_n$, $SSL_{n+1}$, in this arrangement. String select lines 106, 107, 108, are connected to the gates of string select transistors in each NAND string.

Ground select transistors 90-95 are arranged at the other ends of the NAND strings. The ground select transistor couples the memory string to the common source line 99.

The ground select line GSL 159 in this example is coupled to the gates of the ground select transistors 90-95, and can be implemented in the same manner as the word lines 160, 161. The string select transistors and ground select transistors can use a gate dielectric that comprises a modified dielectric charge trapping stack, as indicated by the difference between the symbols used for the switch transistors and memory cells in the diagram. Also, the channel lengths and widths of the switch transistors can be adjusted as suits the designer to provide the switching function for the transistors.

Figure 3:
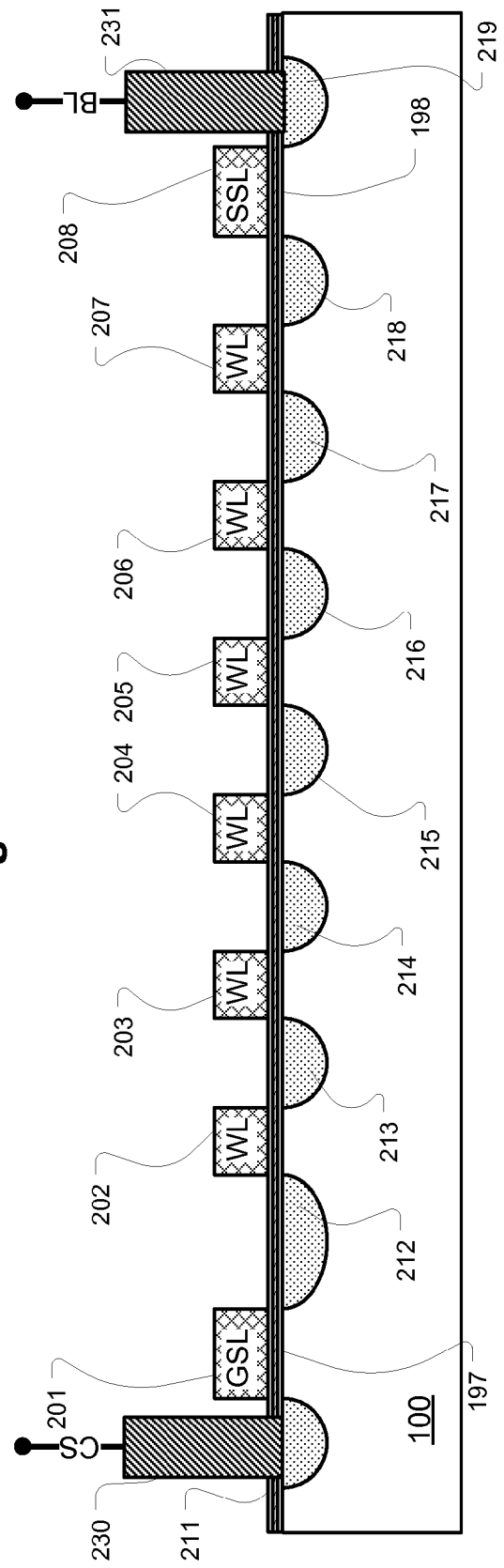
FIG. 3 is a simplified cross-sectional view of a NAND string according to prior art implementations that use the charge trapping structure as the gate dielectric for the string select transistor and ground select transistor.

FIG. 3 shows in cross-section a plurality of dielectric charge trapping flash memory cells arranged in series to form a NAND string, such as has been used in the prior art. One technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology, thin film cell technology and others. See, for an example of vertical NAND structures, European Patent Application No. EP 2 048 709 by Kim et al. entitled "Non-volatile memory device, method of operating same and method of fabricating the same."

Referring to FIG. 3, the memory cells are formed in a semiconductor body 100. For n-channel memory cells, the semiconductor body 100 can be an isolated p-well, within a deeper n-well in a semiconductor chip. Alternatively, the semiconductor body 100 can be isolated by an insulating layer or otherwise. Some embodiments may employ p-channel memory cells in which the doping for the semiconductor body would be n-type.

The plurality of flash memory cells is arranged in a string extending in a bit line direction, orthogonal to word lines. Word lines 202-207 extend across a number of parallel NAND strings. Terminals 212-218 can be optionally formed by n-type regions (for n-channel devices) in the semiconductor body 100, and act as the source/drain regions for the memory cells. A first switch formed by a MOS transistor having a gate in a ground select line GSL 201 is connected between the memory cell corresponding with first word line 202 and a contact 211 formed by an n-type region in the semiconductor body 100. The contact 211 is connected to common source CS line 230. A second switch formed by a MOS transistor having a gate in a string select line SSL 208 is connected between the memory cell corresponding to the last word line 207 and a contact 219 formed by an n-type region in the semiconductor body 100. The contact 219 is connected to a bit line BL 231. The first and second switches in the illustrated embodiment are MOS transistors, having gate dielectrics 197 and 198 formed by the same multilayer structure as used for the charge trapping structure in the memory cells.

In this illustration, there are six memory cells in the string for simplicity. In typical implementations, a NAND string may comprise 16, 32 or more memory cells arranged in series. The memory cells corresponding to the word lines 202-207 have dielectric charge trapping structures between the word lines and channel regions in the semiconductor body 100. Also, embodiments of NAND flash structures have been developed which are junction-free, where the terminals 213-217, and optionally terminals 212 and 218, may be omitted from the structure.

Figure 4:
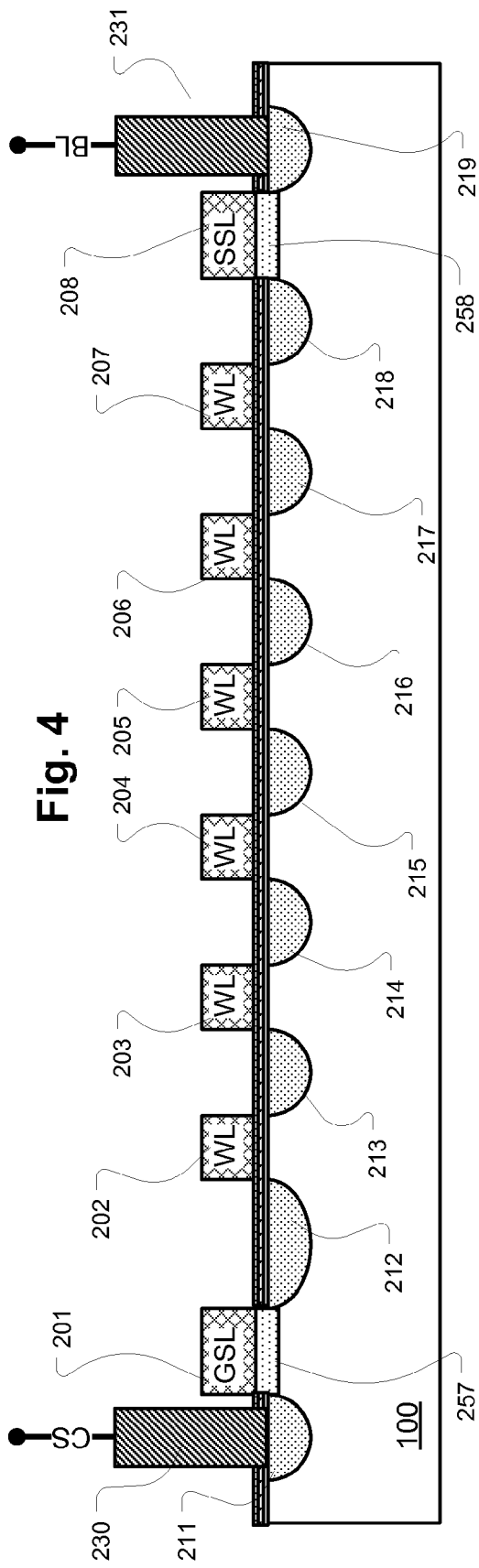
FIG. 4 is a simplified cross-sectional view of a NAND string having a string select transistor and ground select transistor as described herein according to a first embodiment.

FIG. 4 illustrates a NAND string like that of FIG. 3, where like components are given the same reference numerals. In FIG. 4, the gate dielectric 258 for the string select transistor and the gate dielectric 257 for the ground select transistor are different than the charge trapping structure used in the memory cells. In this example, the gate dielectrics 257, 258 can be made by a process in which the dielectric charge trapping structure consists of a blocking dielectric layer, charge trapping layer and tunneling layer, such as the SONOS-type silicon oxide/silicon nitride/silicon oxide (ONO) structure. The dielectric charge trapping structure can be deposited in a blanket deposition over the memory area of the array. After the deposition of a dielectric charge trapping structure, a patterned mask is applied to reveal of the switch transistor regions of the gate dielectrics 257, 258. Then the top layers (blocking layer and charge trapping layer), such as the oxide and the nitride of an ONO structure are removed, leaving the lower tunneling layer, which typically comprises a silicon oxide or silicon oxynitride layer. Then, the structure is exposed to an oxidizing atmosphere to increase the thickness of the oxide of the tunneling layer, including consuming some of the semiconductor body for formation of the silicon oxide, to form a thicker gate dielectric. This can improve the ability of the string select transistor and ground select transistor to handle higher voltages, while preventing charge trapping that can result in uneven distributions of the threshold for the devices.

Figure 5:
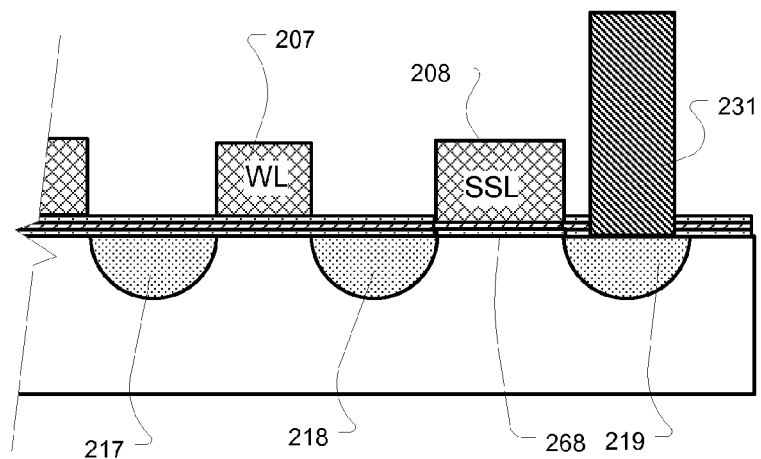
FIG. 5 is a simplified cross-sectional view of the string select end of a NAND string in the string select transistor and ground select transistor as described herein according to a second embodiment.

FIG. 5 illustrates the string select end of a NAND string like that of FIG. 3, where like components are given the same reference numerals. In FIG. 5, the gate dielectric 268 for the string select transistor and, although not shown, optionally the gate dielectric for the ground select transistor, comprise a modified dielectric charge trapping structure, and as a result are different than the charge trapping structure used in the memory cells. In this example, the gate dielectric 268 can be made by a process in which the dielectric charge trapping structure consists of a blocking dielectric layer, charge trapping layer and tunneling layer, such as the SONOS-type silicon oxide/silicon nitride/silicon oxide (ONO) structure. The dielectric charge trapping structure can be deposited in a blanket deposition over the memory area of the array. After the deposition of a dielectric charge trapping structure, a patterned mask is applied to reveal of the switch transistor regions of the gate dielectrics 268. Then the top layer (blocking layer), such as the top oxide ride of an ONO structure are removed, leaving the charge trapping layer, which can comprise silicon nitride about 5 to 8 nanometers thick, and the lower tunneling layer, which typically comprises a silicon oxide or silicon oxynitride layer. Because the top blocking layer is removed, the modified structure is not capable of retaining significant charge. As a result, uneven distributions of the threshold for the devices are prevented.

Figure 6:
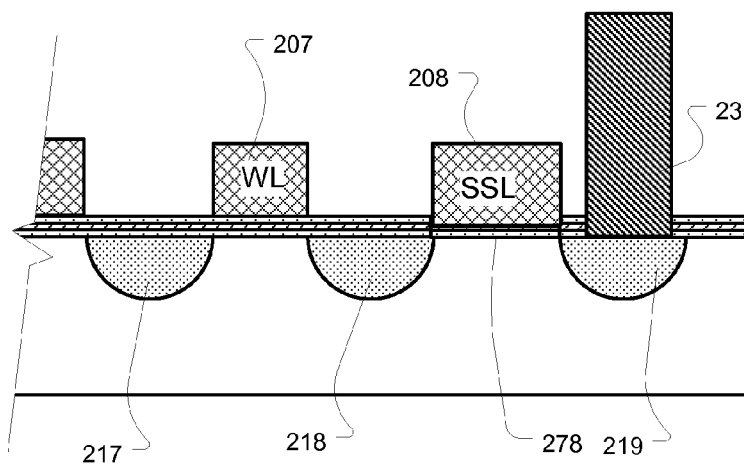
FIG. 6 is a simplified cross-sectional view of the string select end of a NAND string in the string select transistor and ground select transistor as described herein according to a third embodiment.

FIG. 6 illustrates the string select end of a NAND string like that of FIG. 3, where like components are given the same reference numerals. In FIG. 6, the gate dielectric 278 for the string select transistor and, although not shown, optionally the gate dielectric for the ground select transistor, comprise a modified dielectric charge trapping structure and, as a result, are different than the charge trapping structure used in the memory cells. In this example, the gate dielectric 278 can be made by a process in which the dielectric charge trapping structure consists of a blocking dielectric layer, charge trapping layer and tunneling layer, such as the SONOS-type silicon oxide/silicon nitride/silicon oxide (ONO) structure. The dielectric charge trapping structure can be deposited in a blanket deposition over the memory area of the array. After the deposition of a dielectric charge trapping structure, a patterned mask is applied to reveal of the switch transistor regions of the gate dielectrics 278. Then the top layer (blocking layer), such as the top oxide ride of an ONO structure are removed, leaving the charge trapping layer, which can comprise silicon nitride about 5 to 8 nanometers thick, and the lower tunneling layer, which typically comprises a silicon oxide or silicon oxynitride layer. In addition, a portion of the charge trapping layer is removed, to reduce its thickness. In the case of silicon nitride charge trapping layers, it is preferred to reduce the thickness of the layer to less than 3 nanometers. Because the blocking layer is removed, and the charge trapping layer thickness is reduced, the modified structure is not capable of retaining significant charge. As a result, uneven distributions of the threshold for the devices are prevented.

Figure 7:
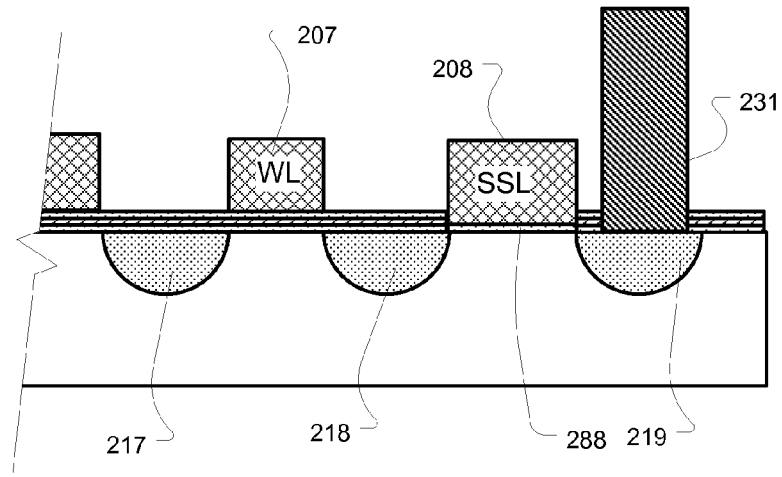
FIG. 7 is a simplified cross-sectional view of the string select end of a NAND string in the string select transistor and ground select transistor as described herein according to a fourth embodiment.

FIG. 7 illustrates the string select end of a NAND string like that of FIG. 3, where like components are given the same reference numerals. In FIG. 7, the gate dielectric 288 for the string select transistor and, although not shown, optionally the gate dielectric for the ground select transistor comprise a modified dielectric charge trapping structure and, as a result, are different than the charge trapping structure used in the memory cells. In this example, the gate dielectric 288 can be made by a process in which the dielectric charge trapping structure consists of a blocking dielectric layer, charge trapping layer and tunneling layer, such as the SONOS-type silicon oxide/silicon nitride/silicon oxide (ONO) structure. The dielectric charge trapping structure can be deposited in a blanket deposition over the memory area of the array. After the deposition of a dielectric charge trapping structure, a patterned mask is applied to reveal of the switch transistor regions of the gate dielectrics 288. Then the top layer (blocking layer), such as the top oxide ride of an ONO structure are removed, leaving the charge trapping layer, which can comprise silicon nitride about 5 to 8 nanometers thick, and the lower tunneling layer, which typically comprises a silicon oxide or silicon oxynitride layer. In addition, all or substantially all of the charge trapping layer is removed. Because the charge trapping layer is removed, the modified structure is not capable of retaining charge. As a result, uneven distributions of the threshold for the devices are prevented. As mentioned above in connection with FIG. 4, the tunnel oxide may be very thin in some embodiments, including on the order of 3 nanometers or less. Thus, further processing can be applied to thicken the tunnel oxide to improve high voltage performance. Also, additional dielectric that does not trap significant charge can be deposited, to increase the thickness of the gate dielectric.

If an oxidation process is utilized to thicken the layer 288, then some of the silicon substrate can be consumed. In a typical process applied to form an oxide by oxidizing an exposed silicon layer, the silicon layer is consumed so that the ratio d2/d1 of the thickness d2 of the oxide over the beginning level of the silicon layer to the thickness d1 of the oxide below the beginning level is about 55/45. By applying an oxide process to the structure as shown in FIG. 7, having a thin tunneling oxide thereon at the beginning, a thicker oxide can be formed in which the ratio d2/d1 is greater than 55/45. This can be important in thin film transistor embodiments, and in 3D embodiments like those described below.

In other embodiments, the tunnel oxide can be replaced using a BE-SONOS multilayer tunneling layer, as described below. The charge trapping structure can be modified in the same manner as described above, including removing the blocking layer only, removing the blocking layer and oxidizing the thicker charge trapping nitride layer either fully or partially, removing the blocking layer and the charge trapping layer completely while leaving the multilayer tunneling layer, exposing and then oxidizing the multilayer tunneling layer to convert the thin silicon nitride to an oxide, to diffuse oxygen to the substrate and consume some of the substrate into oxide formation or to do both.

FIGS. 8-10 illustrate the memory array structure for one example in which the modified gate dielectric for the switch transistors (not illustrated) can be applied. FIG. 8 is a perspective drawing of a 2×2 portion of a three-dimensional charge trapping memory array with fill material removed from the drawing to give a view of the stacks of semiconductor strips and orthogonal word lines that make up the 3D array. In this illustration, only two layers are shown. However, the number of layers can be extended to very large numbers. As shown in FIG. 5, the memory array is formed on an integrated circuit substrate having an insulating layer 810 over underlying semiconductor or other structures (not shown). The memory array includes a plurality of stacks (2 are shown in the drawing) of semiconductor strips 811, 812, 813, 814 separated by insulating material 821, 822, 823, 824. The stacks are ridge-shaped extending on the Y-axis as illustrated in the figure, so that the semiconductor strips 811-814 can be configured as memory cell strings. Semiconductor strips 811 and 813 can act as memory cell strings in a first memory plane. Semiconductor strips 812 and 814 can act as memory cell strings in a second memory plane.

The insulating material 821 between the semiconductor strips 811 and 812 in a first stack and the insulating material 823 between semiconductor strips 813 and 814 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 815 of memory material, such as a dielectric charge trapping structure, coats the plurality of stacks of semiconductor strips in this example. A plurality of word lines 816, 817 is arranged orthogonally over the plurality of stacks of semiconductor strips. The word lines 816, 817 have surfaces conformal with the plurality of stacks of semiconductor strips, filling the trenches (e.g. 820) defined by the plurality of stacks, and defining a multi-layer array of interface regions at cross-points between side surfaces of the semiconductor strips 811-814 on the stacks and word lines 816, 817. A layer of silicide (e.g. tungsten silicide, cobalt silicide, titanium silicide) 818, 819 can be formed over the top surfaces of the word lines 816, 817.

As a result, a 3D array of SONOS-type memory cells configured in a NAND flash array can formed. The source, drain and channel are formed in the silicon (S) semiconductor strips 811-814, the layer 815 includes a tunneling layer 837 which can be formed of silicon oxide (O), a charge storage layer 838 which can be formed of silicon nitride (N), a blocking dielectric layer 839 which can be formed of silicon oxide (O). The gates of the memory cells comprise polysilicon (S) of the word lines 816, 817.

The semiconductor strips 811-814 can be a p-type semiconductor material. The word lines 816, 817 can be a semiconductor material with the same or a different conductivity type (e.g. p+-type). For example, the semiconductor strips 811-814 can be made using p-type polysilicon, or p-type epitaxial single crystal silicon, while the word lines 816, 817 can be made using relatively heavily doped p+-type polysilicon.

Alternatively, the semiconductor strips 811-814 can be n-type semiconductor material. The word lines 816, 817 can be a semiconductor material with the same or a different conductivity type (e.g. p+-type). This n-type strip arrangement results in buried-channel, depletion mode charge trapping memory cells. For example, the semiconductor strips 811-814 can be made using n-type polysilicon, or n-type epitaxial single crystal silicon, while the word lines 816, 817 can be made using relatively heavily doped p+-type polysilicon. A typical doping concentration for n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NAND strings and thereby allowing higher read current.

Thus, memory cells comprising field effect transistors having charge storage structures are formed in the 3D array of cross-points. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity (1012) in a single chip.

The layer 815 of memory material can comprise other charge storage structures. For example, a bandgap engineered SONOS (BE-SONOS) charge storage structure can be used which includes a tunneling layer 837 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 815 in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 815 of memory material includes a bandgap engineered composite tunneling dielectric layer comprising a layer of silicon dioxide less than 2 nm thick, a layer of silicon nitride less than 3 nm thick, and a layer of silicon dioxide less than 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 815 of memory material in this embodiment comprises silicon nitride having a thickness greater than 5 nanometers, including for example about 7 nanometers in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 815 of memory material in this embodiment comprises a layer of silicon dioxide having a thickness greater than 5 nanometers, including for example about 9 nanometers in this embodiment, and can be formed by wet conversion from the nitride by a wet furnace oxidation process. Other embodiments may be implemented using high temperature oxide (HTO) or LPCVD $SiO_2$. Other blocking dielectrics can include high-κ materials like aluminum oxide.

In a representative embodiment, the hole tunneling layer can be 1.3 nanometers of silicon dioxide; the band offset layer can be 20 Å of silicon nitride; the isolation layer can be 2.5 nanometers of silicon dioxide; the charge trapping layer can be 7 nanometers of silicon nitride; and the blocking dielectric layer can be silicon oxide 9 nanometers thick. The gate material is p+ polysilicon (work function about 5.1 eV) used in the word lines 816, 817.

FIG. 9 shows a cross-section view cut in the X-Z plane of the charge trapping memory cell formed at the intersection of word line 816 and semiconductor strip 814. Active charge trapping regions 825, 826 are formed on the both sides of the strip 814 between the word lines 816 and the strip 814. In the embodiment described here, each memory cell is a double gate field effect transistor having active charge trapping regions 825, 826, one on each side of the semiconductor strip 814. Electron current as illustrated by the solid arrows in the diagram flows along the p-type semiconductor strips, to sense amplifiers where it can be measured to indicate the state of a selected memory cell.

FIG. 10 shows a cross-section view cut in the X-Y plane of the charge trapping memory cell formed at the intersection of the word lines 816, 817 and the semiconductor strip 814. The current path down the semiconductor strip 814 is illustrated. The source/drain regions 828, 829, 830 between the word lines 816, 817 can be "junction-free," without source and drain doping having a conductivity type opposite that of the channel regions beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor strips 811-814 can be implemented using a lightly doped n-type semiconductor body in junction-free arrangements, resulting in a buried-channel field effect transistor which can operate in depletion mode, with naturally shifted lower threshold distributions for the charge trapping cells.

Figure 11:
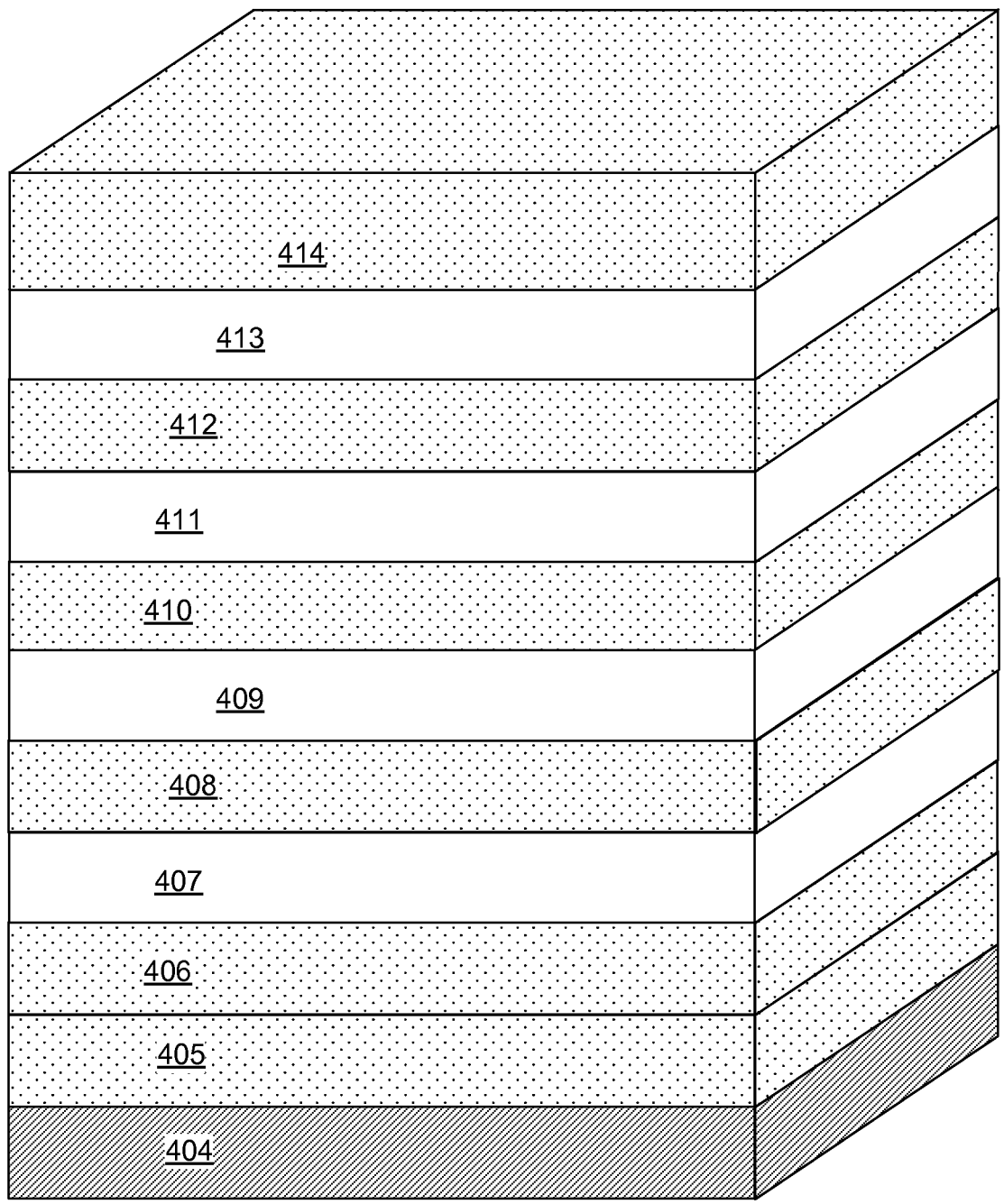
FIG. 11 illustrates a first stage in a process for manufacturing a memory device like that of FIG. 1.

FIGS. 11-19 illustrate stages in a basic process flow for implementing 3D memory arrays as described above including gate dielectrics for the switch transistors that comprise modified charge trapping structures. In FIG. 11, a structure is shown which results from alternating deposition of insulating layers 406, 408, 410, 412, 414 and semiconductor layers 407, 409, 411, 413 formed using doped semiconductors for example in a blanket deposition in the array area of a substrate, that in this example comprises underlying insulating layer 405 and a semiconductor chip 404. Depending on the implementation, the semiconductor layers 407, 409, 411, 413 can be implemented using deposited or grown polysilicon or single crystal silicon having n-type or p-type doping. Inter-level insulating layers 406, 408, 410, 412, 414 can be implemented for example using silicon dioxide, other silicon oxides, or silicon nitride. These layers can be formed in a variety of ways, including low pressure chemical vapor deposition LPCVD processes available in the art.

Figure 12:
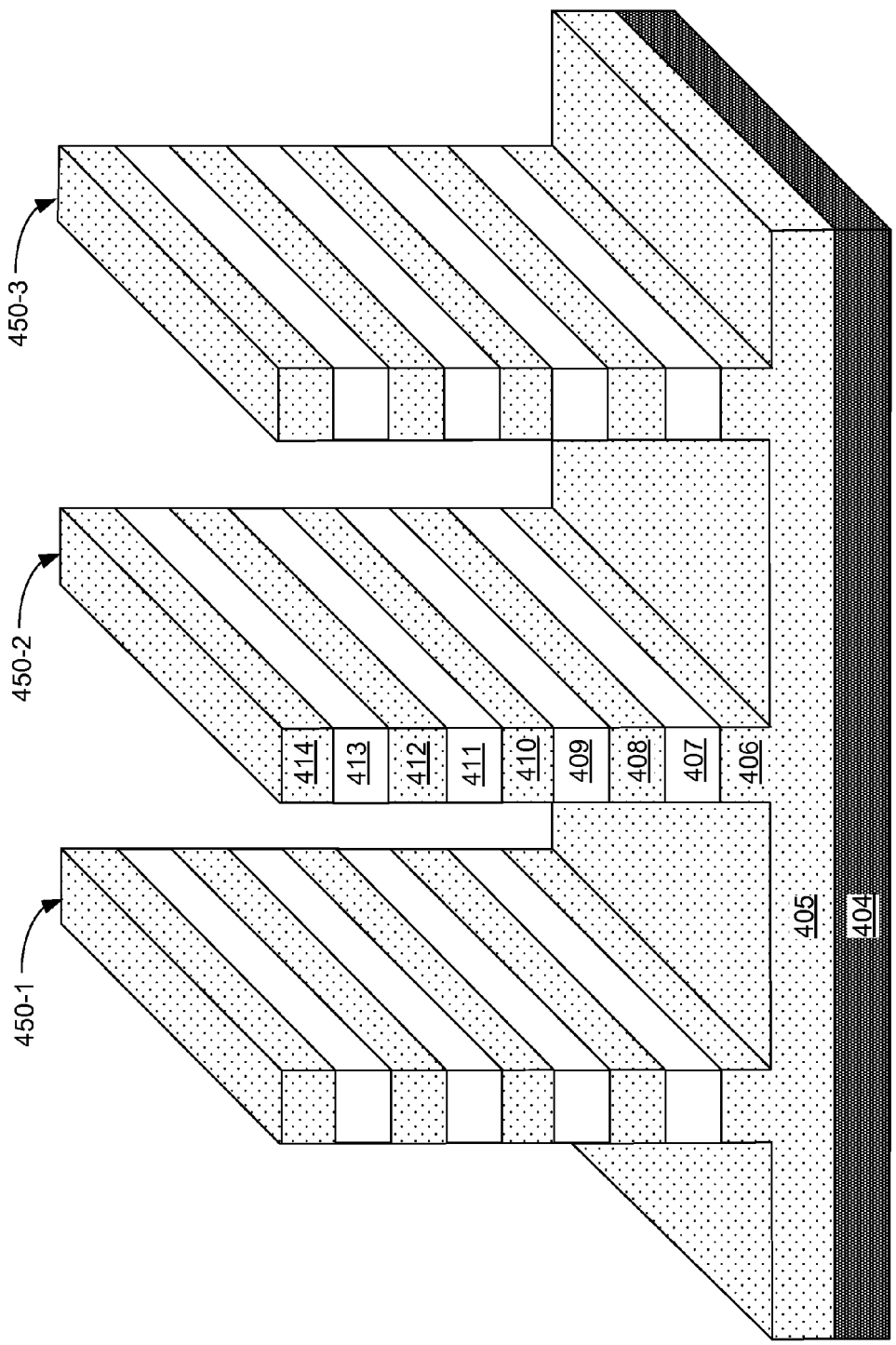
FIG. 12 illustrates a second stage in a process for manufacturing a memory device like that of FIG. 1.

FIG. 12 shows the result of a first lithographic patterning step used to define a plurality of ridge-shaped stacks 450-1, 450-2, 450-3 of semiconductor strips to act as local bit lines, where the semiconductor strips are implemented using the material of the semiconductor layers 407, 409, 411, 413, and separated from one another by the insulating layers 408, 410, 412, 414 and from the substrate (405, 404) by layer 406. Deep, high aspect ratio trenches can be formed in the stack, supporting many layers, using lithography based processes applying a carbon hard mask and reactive ion etching.

Figure 13:
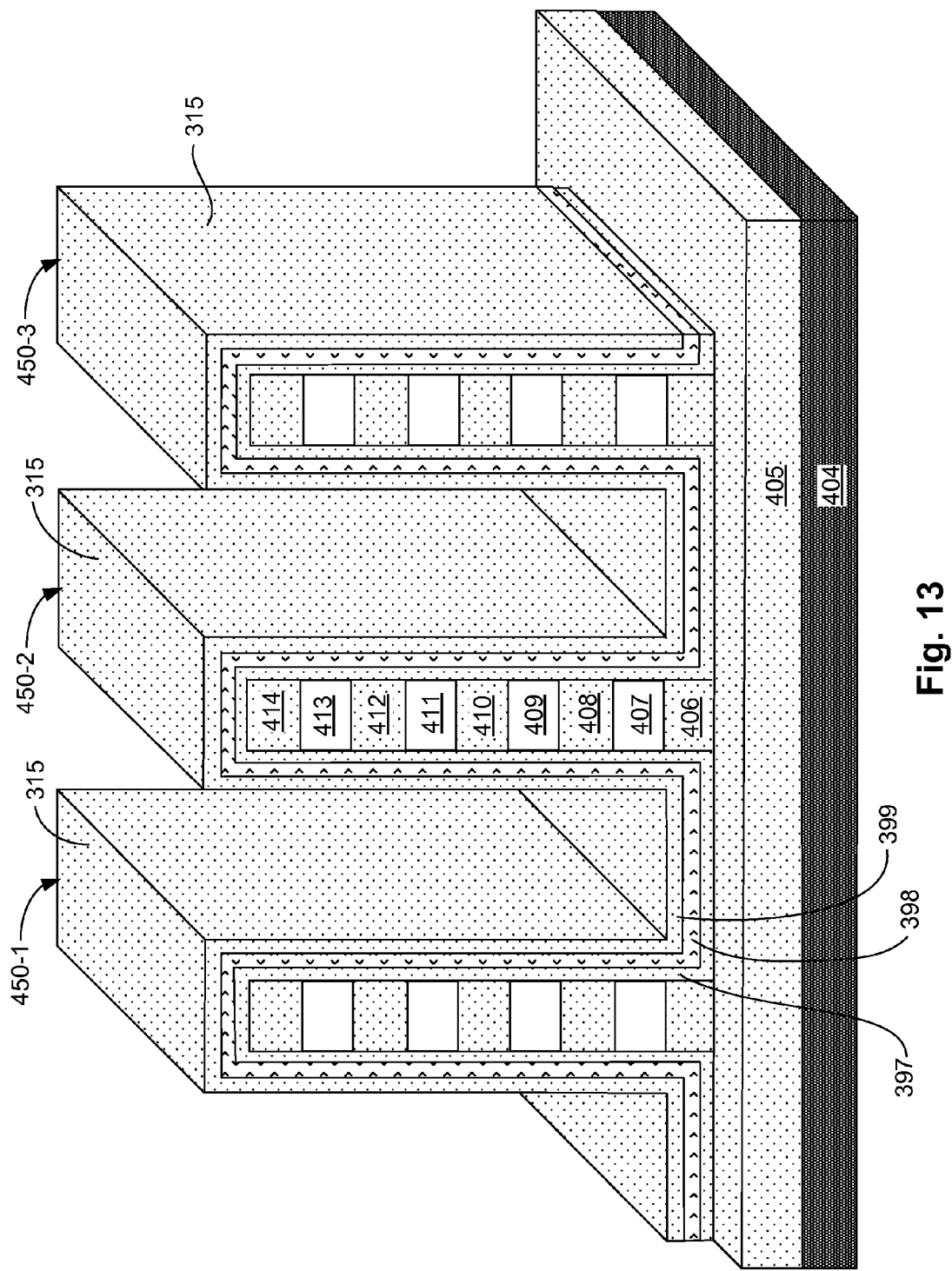
FIG. 13 illustrates a third stage in a process for manufacturing a memory device like that of FIG. 1.

FIG. 13 shows results of blanket deposition of a multilayer charge trapping structure 315 including a tunneling layer 397, a charge trapping layer 398 and a blocking layer 399 as described above. As shown in FIG. 13, the layers 397, 398, 399 are deposited in a blanket, conformal manner over the ridge-shaped stacks 450-1, 450-2, 450-3 of semiconductor strips. The layers 397, 398, 399 may comprise a BE-SONOS charge trapping structure as described above, in which the tunneling layer (layer 397) consists of a multilayer tunneling structure.

Figure 14:
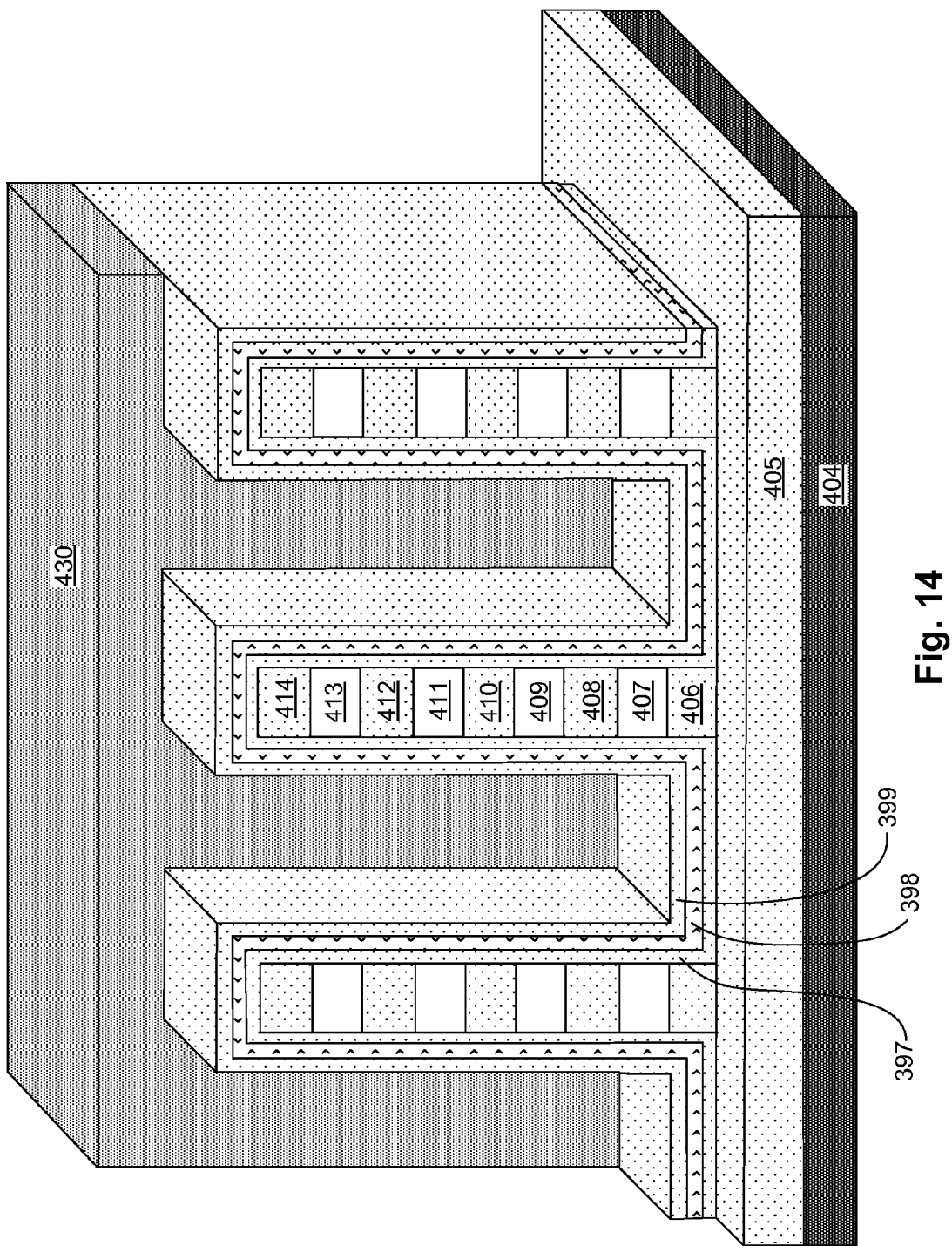
FIG. 14 illustrates a fourth stage in a process for manufacturing a memory device like that of FIG. 1.

FIG. 14 illustrates a stage in the process after applying and patterning a photoresist fill, to form a mask block 430, to be used for protecting the multilayer charge trapping structure 315 on the memory cells, to protect it from modification during the processes to form the gate dielectrics for the switch transistors.

FIG. 14 provides a simplified perspective of the structure where the mask block 430 exposes the switch transistor regions in the multilayer charge trapping structure 315 to be modified to form gate dielectrics for the switch transistors, such as in the locations of the SSL line and GSL line shown in FIG. 1. Although the figure shows that the opening extend to the ends of the strips, in a preferred implementation the openings are confined more strictly to the regions of the switch transistors and will comprise trenches orthogonal to the strips in the layers 407, 409, 411, 413 for the GSL lines, and will comprise openings matching the layouts of the gate structures for the SSL switch transistors in an embodiment like that of FIG. 1.

Figure 15:
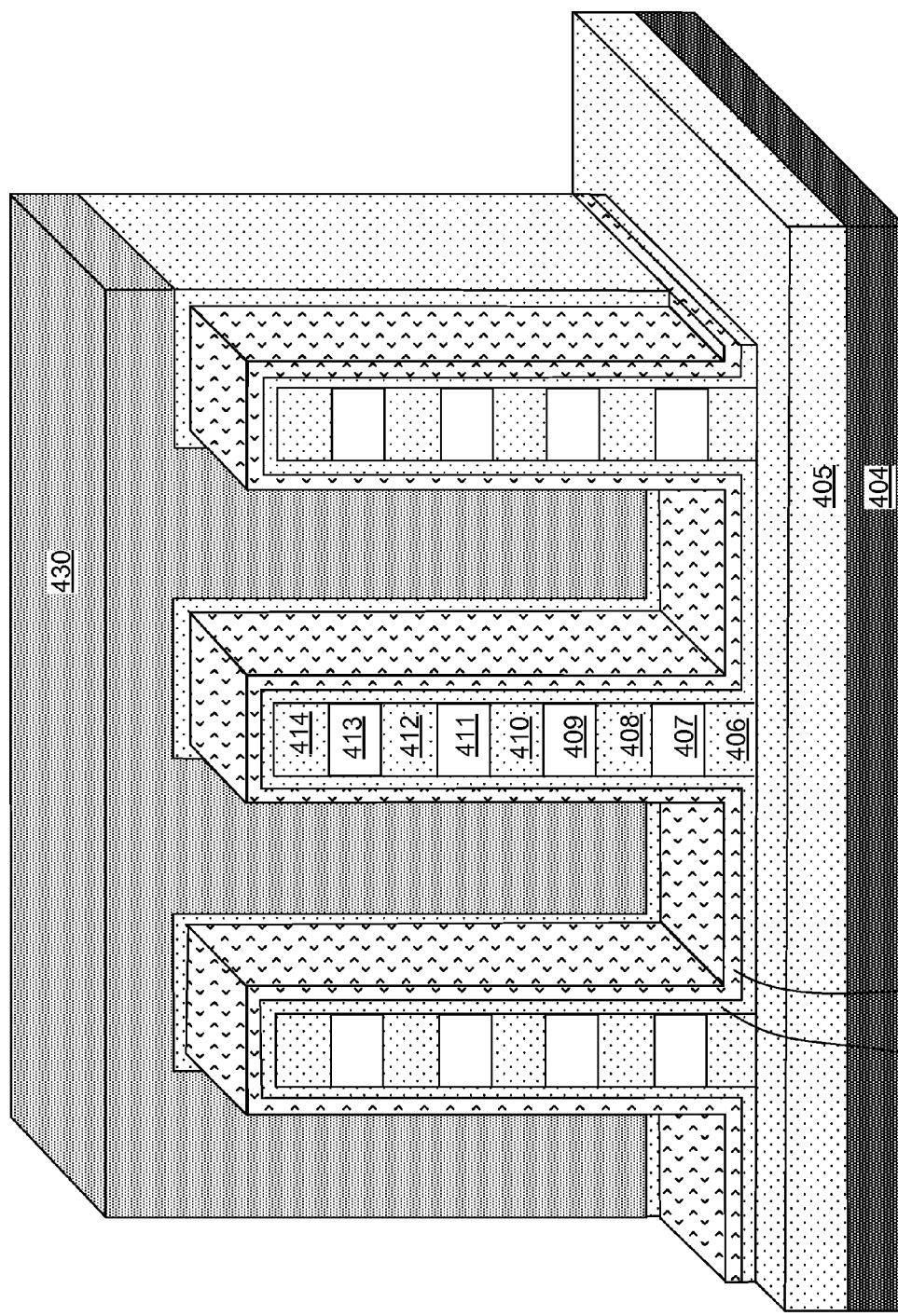
FIG. 15 illustrates a fifth stage in a process for manufacturing a memory device like that of FIG. 1.

FIG. 15 illustrates the structure in a following stage of the manufacturing process, after the top layer 399 of the multilayer charge trapping structure 315 has been removed from regions exposed by the mask 430. In embodiments in which the top layer 399 is a silicon oxide, it may be removed from the exposed regions, for example, using a buffered oxide etch (BOE) dip process.

Figure 16:
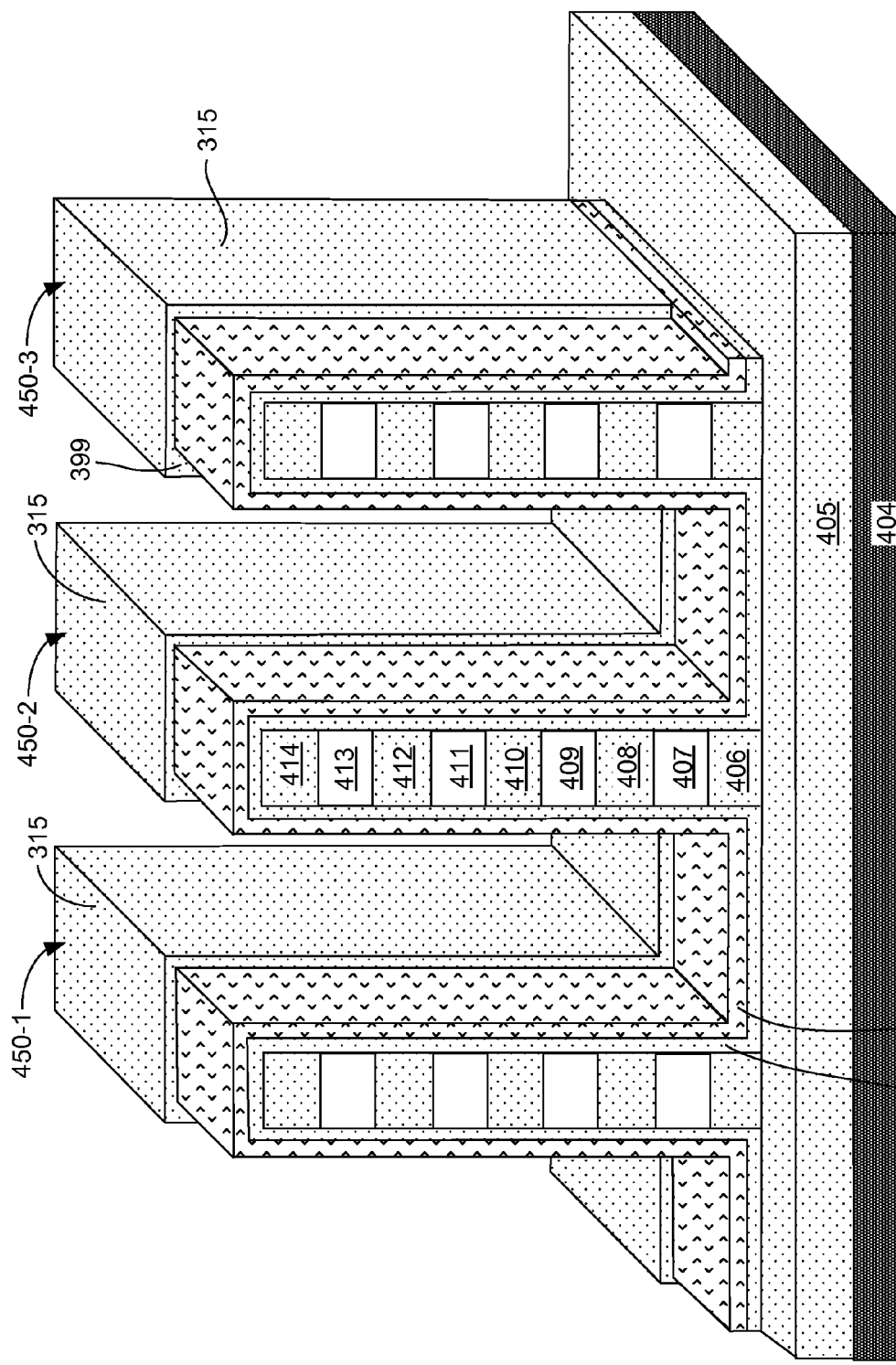
FIG. 16 illustrates a sixth stage in a process for manufacturing a memory device like that of FIG. 1.

FIG. 16 illustrates the structure in a following stage of a manufacturing process, after the mask block 430 has been removed. In embodiments in which the mask block comprises a photoresist mask, it may be removed using a photoresist strip process. The resulting structure comprises the ridge-shaped stacks 450-1, 450-2, 450-3 of semiconductor strips, having a dielectric charge trapping structure in the regions of the memory cells (i.e. side walls of the strips 407, 409, 411, 413), and having the top layer of the dielectric charge trapping structures removed in the regions of the SSL and GSL switch transistors, exposing the intermediate layer 398 (nitride in this example). From this structure, the gate dielectric of the SSL and GSL switch transistors in the strips can be completed as discussed above in connection with FIGS. 4-7, for example.

Figure 17:
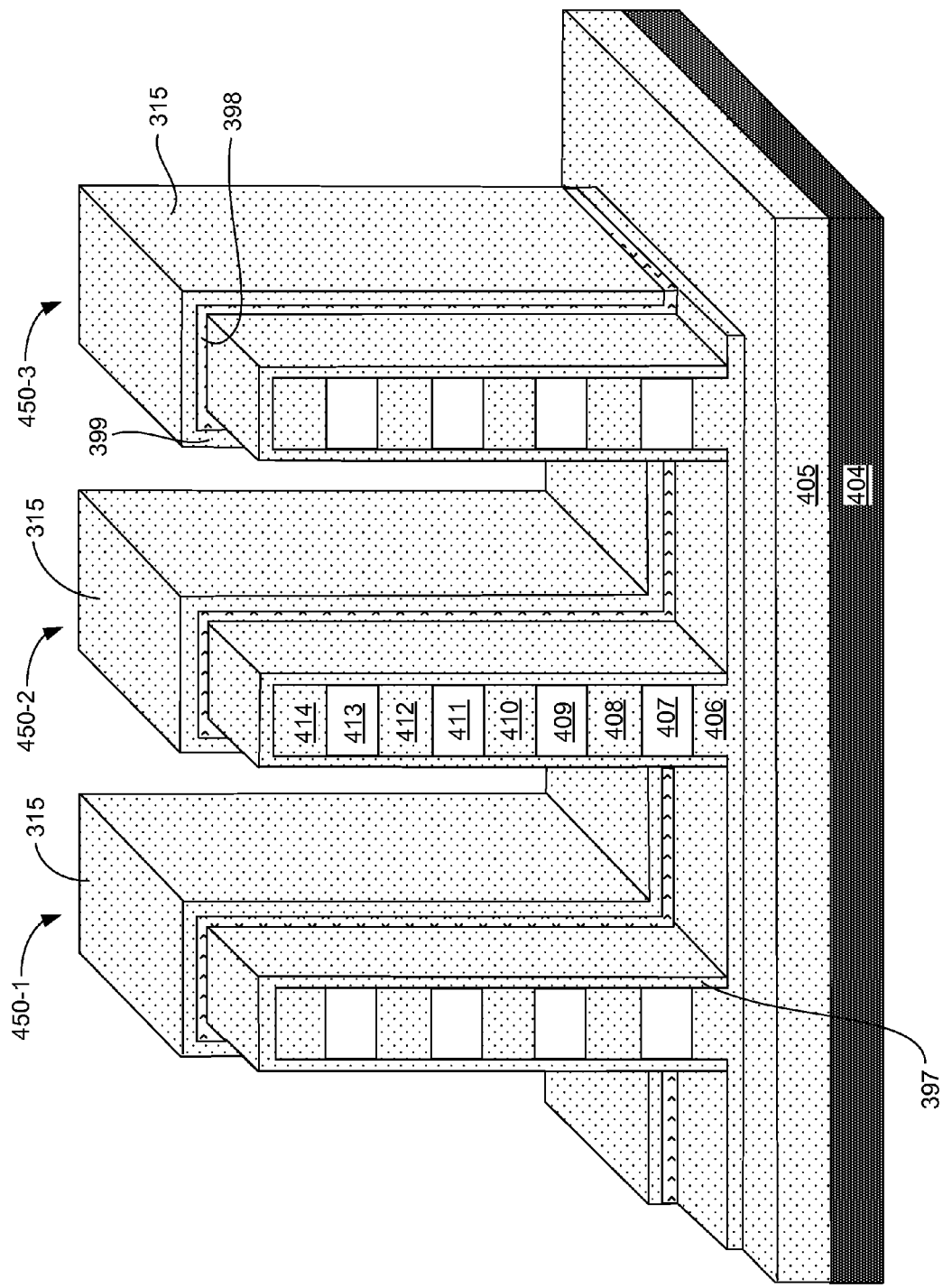
FIG. 17 illustrates a seventh stage in a process for manufacturing a memory device like that of FIG. 1.

FIG. 17 shows the structure in a following stage of a manufacturing process, after the intermediate layer 398 has been removed in the regions of the SSL and GSL switch transistors, exposing the bottom layer 397 (tunneling layer oxide or BE-SONOS ONO tunneling layer, for example). Where the intermediate layer 398 comprises a silicon nitride layer, it may be removed for example using a hot phosphoric acid dip, which is highly selective in removing silicon nitride without etching silicon oxide. This leaves the dielectric charge trapping structure 315 in the regions of the memory cells, while leaving only the bottom tunneling layer 397 in the regions of the SSL and GSL switch transistors.

Figure 18:
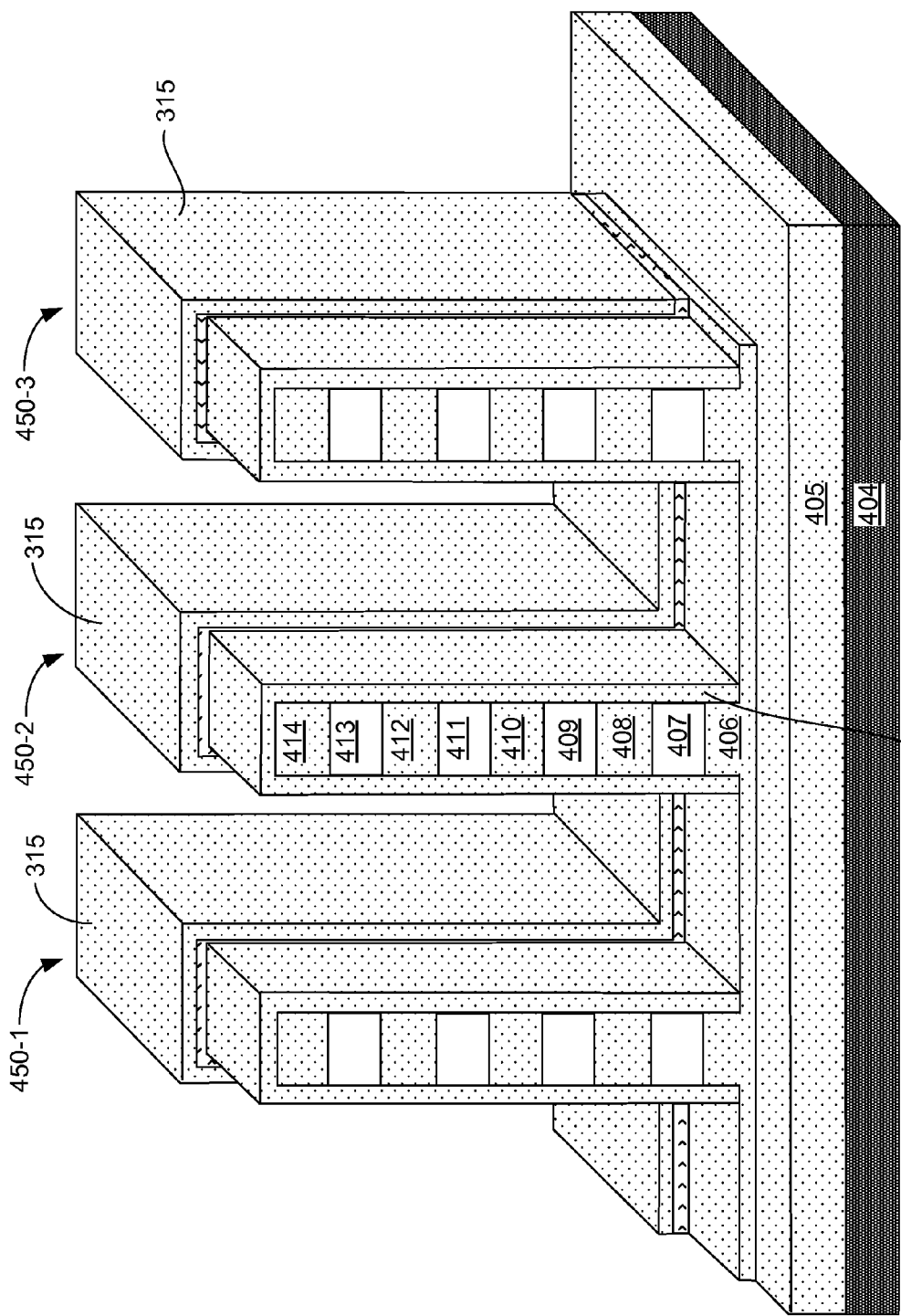
FIG. 18 illustrates an eighth stage in a process for manufacturing a memory device like that of FIG. 1.

FIG. 18 illustrates the structure at a stage of the process after the exposed portions of the multilayer charge trapping structure 315 are removed, as explained above, in the regions of the gate dielectrics for the switch transistors, and then modified to form the gate dielectric layer 490, over the side walls of the strips in the layers 407, 409, 411, 413. The modification can be any of a variety of processes, such as the processes described above in connection with FIGS. 4-7. As shown in the figure, the charge trapping structure 315 in the regions of the memory cells remain un-modified. In this example, a process is applied to increase the thickness of the tunneling layer 397, by applying a thermal oxidation process over the tunneling oxide that converts silicon on the sidewalls of the strips to silicon oxide in order to grow thicker gate dielectric 490. Thus, embodiments described herein have gate dielectric layers for the GSL and SSL switches that have a thickness d2 over the beginning level of the silicon layer that is the sum of the grown oxide and the thickness of the tunneling layer, and a thickness d1 below the beginning level of the silicon layer, such that the ratio d2/d1 is greater than 55/45. As discussed above, applying the oxidation process over the tunneling oxide can result in formation of a relatively thick gate dielectric layer, while conserving the silicon in the strips. Alternatively, a chemical vapor deposition CVD or atomic layer deposition ALD process can be applied to add thickness to the tunneling layer, and form the gate dielectric 490. For embodiments with a small pitch, the latter CVD or ALD alternatives may be desired to preserve silicon in the strips, required to provide the channels and connections to local bit line structures for the switch transistors.

Figure 19:
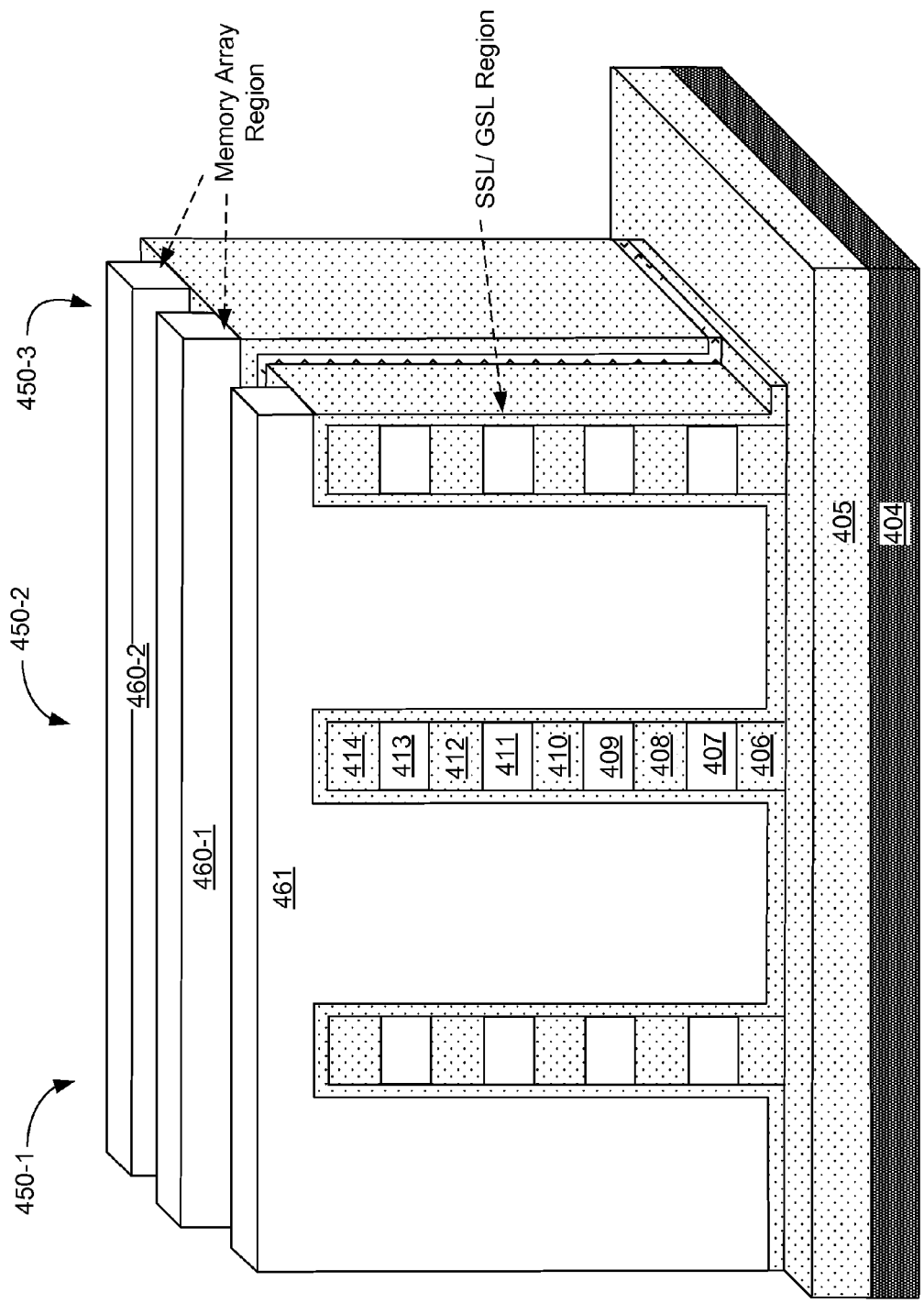
FIG. 19 illustrates a ninth stage in a process for manufacturing a memory device like that of FIG. 1.

FIG. 19 shows the structure at a stage after applying of a high aspect ratio fill step in which conductive material, such as polysilicon having n-type or p-type doping to be used for the word lines and select lines, is deposited and patterned. As illustrated in the figure, high aspect ratio deposition technologies such as low-pressure chemical vapor deposition of polysilicon in the illustrated embodiments is utilized to completely fill the trenches between the ridge-shaped stacks, even very narrow trenches on the order of 10 nanometers wide with high aspect ratio. A lithographic patterning step can be used to define a plurality of word lines 460-1, 460-2 and GLS lines 461 for the 3D memory array. The word lines 460-1, 460-2 and GLS lines 461 can be implemented with the same or with different widths. At this step, the gate structures (e.g. gate structure 20 shown in FIG. 1) which are controlled by string select lines (not shown) can also be defined. The lithographic patterning step utilizes a single mask for critical dimensions of the array for etching high aspect ratio trenches between the word lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on or near the underlying insulating layer 405 on the substrate.

An optional manufacturing step includes forming hard masks over the plurality of word lines, and hard masks over the gate structures. The hard masks can be formed using a relatively thick layer of silicon nitride or other material which can block ion implantation processes. After the hard masks are formed, an implant can be applied to increase the doping concentration in the semiconductor strips, and in stairstep structures, and thereby reduce the resistance of the current path along the semiconductor strips. By utilizing controlled implant energies, the implants can be caused to penetrate to the bottom semiconductor strip, and each overlying semiconductor strip in the stacks. In some embodiments, silicide may be applied to the word lines and GSL lines to improve conductivity of the structures.

Subsequently, the hard masks are removed, exposing the top surfaces of the word lines, and over the gate structures. After an interlayer dielectric is formed over the top of the array, vias are opened in which contact plugs, using tungsten fill for example, are formed reaching to the top surfaces of the gate structures. Overlying metal lines are patterned to connect as SSL lines and global bit lines.

Figure 20:
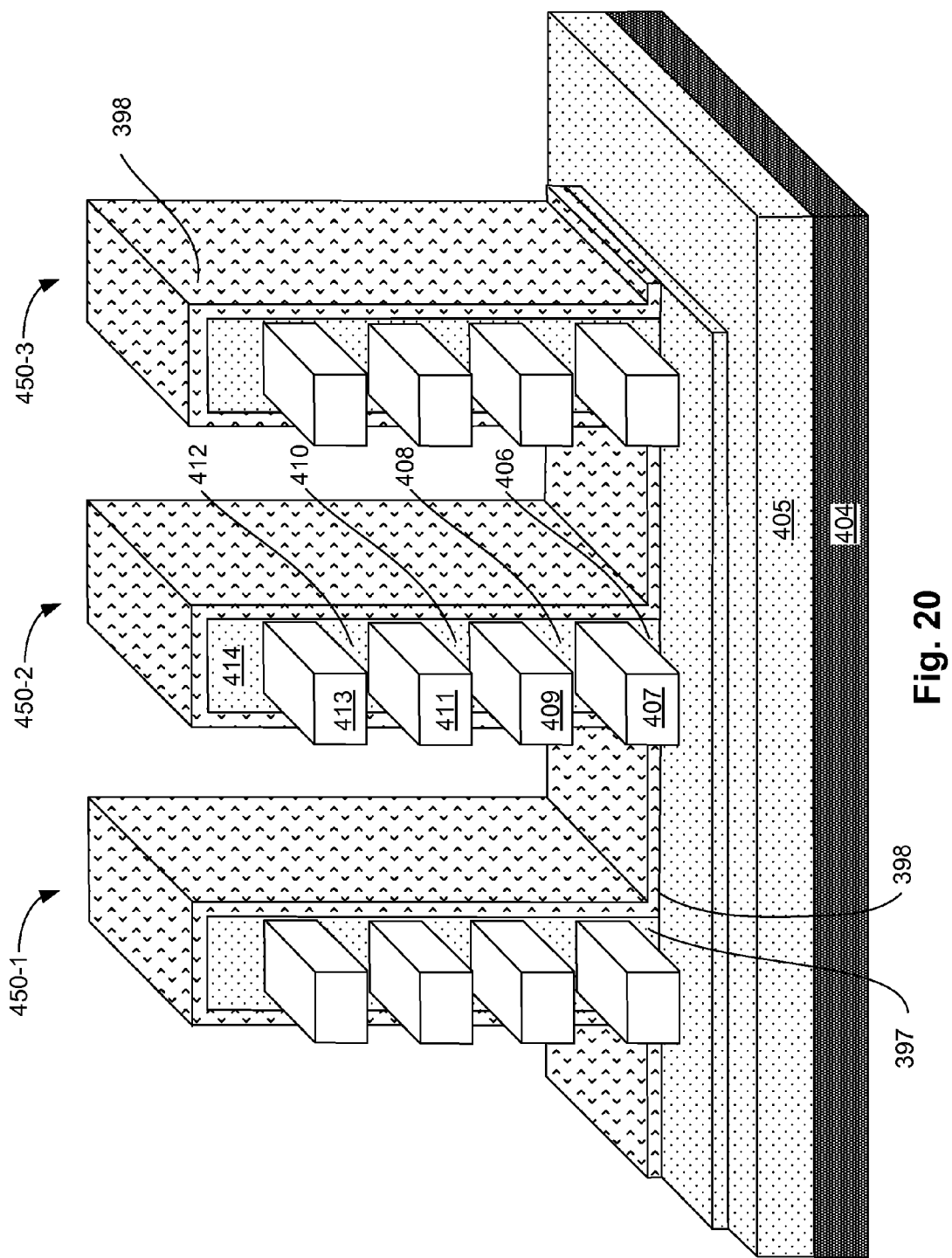
FIGS. 20 through 23 illustrate stages in an alternative process for manufacturing a memory device like that of FIG. 1, with surrounding gate switch transistors.

FIGS. 20-23 illustrate stages in a modification of the process of FIGS. 11-19, which can be applied to form surrounding gate switch transistors for a 3D array. The process can proceed as described above up to the stage of FIG. 17 after removal the top layer 399 and intermediate layer 398 of the multilayer dielectric charge trapping structure in the regions of the SSL and GSL switch transistors. FIG. 20 shows the structure in a stage following a process to remove the dielectric material strips 406, 408, 410, 412, 414 (in this example silicon oxide) from between the polysilicon strips 407, 409, 411, 413 in the stacks 450-1, 450-2, 450-3, in the regions of the SSL and GSL switches, while leaving the dielectric material strips 406, 408, 410, 412, 414 intact, in the region of the memory cells. This can be done in examples in which the dielectric material strips 406, 408, 410, 412, 414 are silicon oxide, and in the dielectric charge trapping structure, the top layer 399 comprises silicon oxide, the intermediate layer comprises silicon nitride and the tunneling layer comprises silicon oxide, by applying a buffered oxide (hydrogen fluoride) dip, which is highly selective for removing silicon oxide. In embodiments in which the multilayer dielectric charge trapping layer comprises a multilayer tunneling layer, such as in the case of a BE-SONOS type structure, an additional step may be needed to remove materials that are not removed using the etch that removes the dielectric strips. As a result of removing the dielectric material strips from the structure, the conductive strips 407, 409, 411, 413 are suspended across the openings in the regions of the SSL and GSL switches, with their surfaces exposed on all sides.

Figure 21:
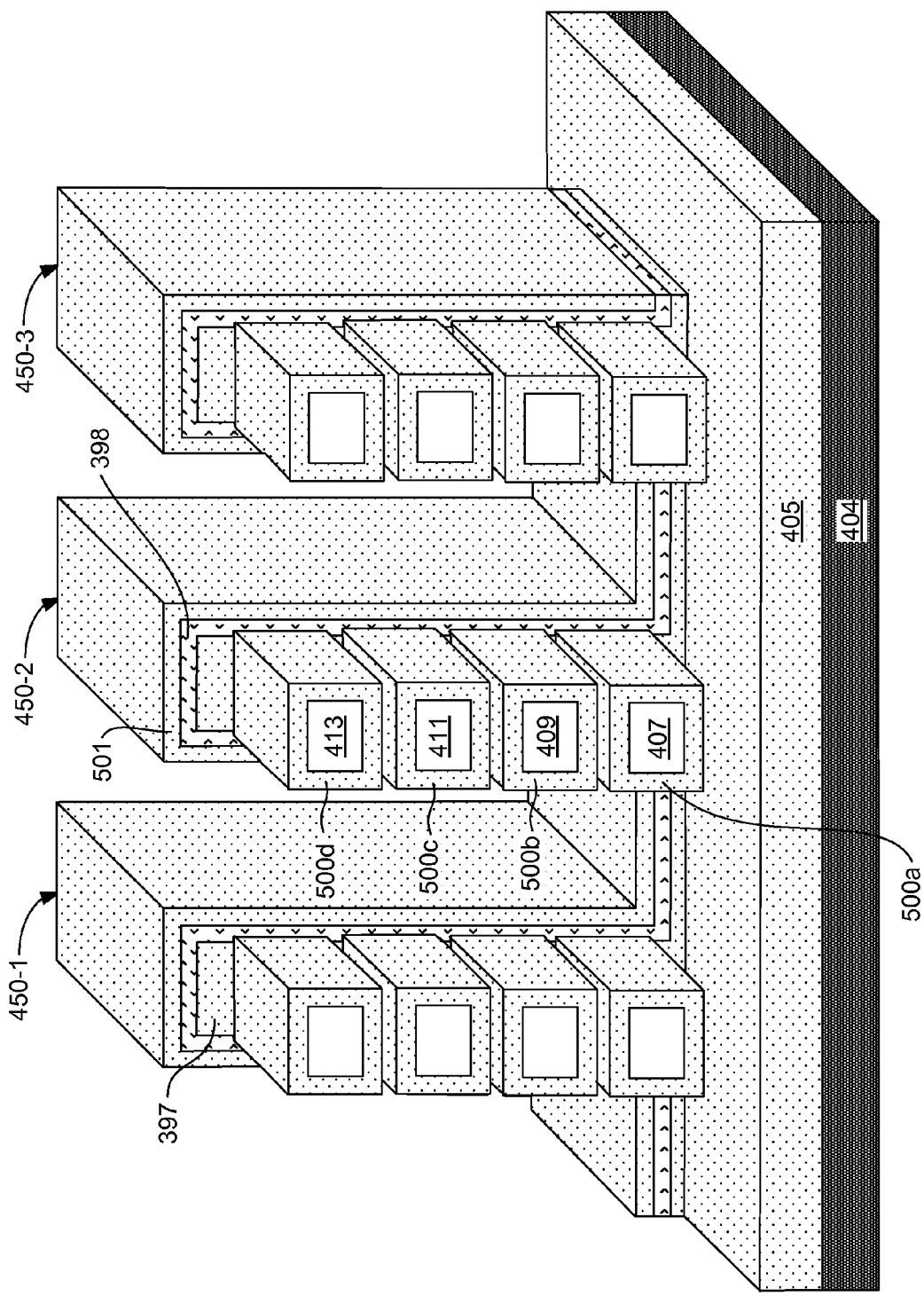

FIG. 21 shows the structure in a stage of the process after formation of surrounding gate dielectric layers (e.g., 500a, 500b, 500c, 500d) on the exposed surfaces of the strips 407, 409, 411, 413 in the regions of the SSL and GSL switches. A thermal oxidation process which consumes silicon from the strips 407, 409, 411, 413 can be applied for this purpose. More preferably in small pitch embodiments, a chemical vapor deposition or atomic layer deposition process. Gate dielectric materials other that silicon oxide, such as an aluminum oxide or a high-K dielectric, can be applied, as suits a particular implementation. The process also results in formation of a layer 501 of dielectric over the intermediate layer 398 of the dielectric charge trapping structure in the regions of the memory cells, which can act as a blocking layer for the dielectric charge trapping structure. Alternative, a material other than that applied for the surrounding gate dielectric layers can be applied as the blocking dielectric material, using appropriate masking and deposition technologies.

Figure 22:
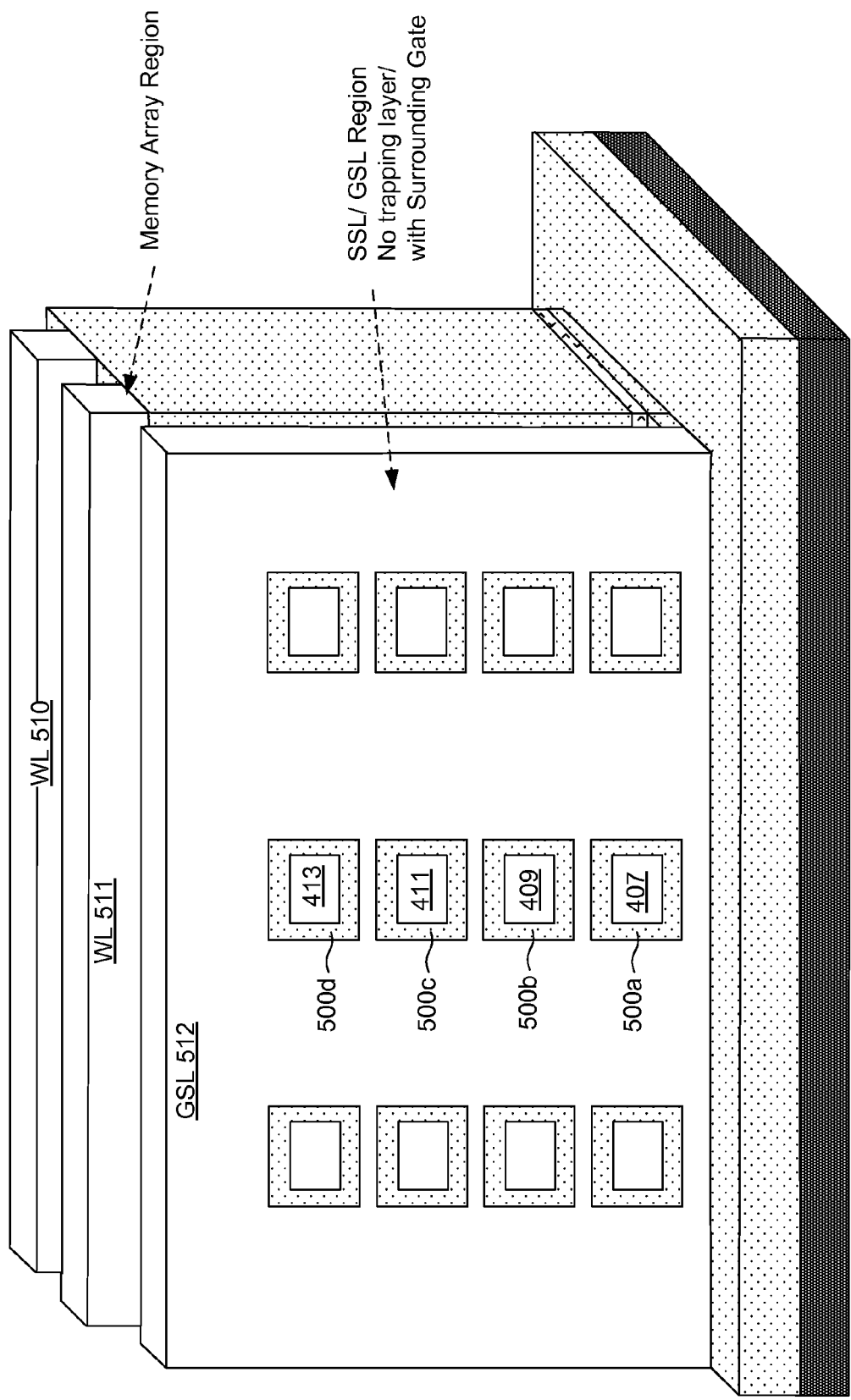

FIG. 22 shows the structure in a subsequent stage of the process, after a conductive fill comprising polysilicon for example, is applied and patterned to form the word lines 510, 511, the GSL lines 512 and the SSL gate structures (not shown) in a manner that fills in the gaps between the surrounding gate dielectrics (500a, 500b, 500c, 500d) on the strips 407, 409, 411, 413, thereby forming surrounding gate switch transistors. A layer of silicide (not shown) can be formed over the conductive fill, in embodiments in which the conductive fill comprises polysilicon.

Figure 23:
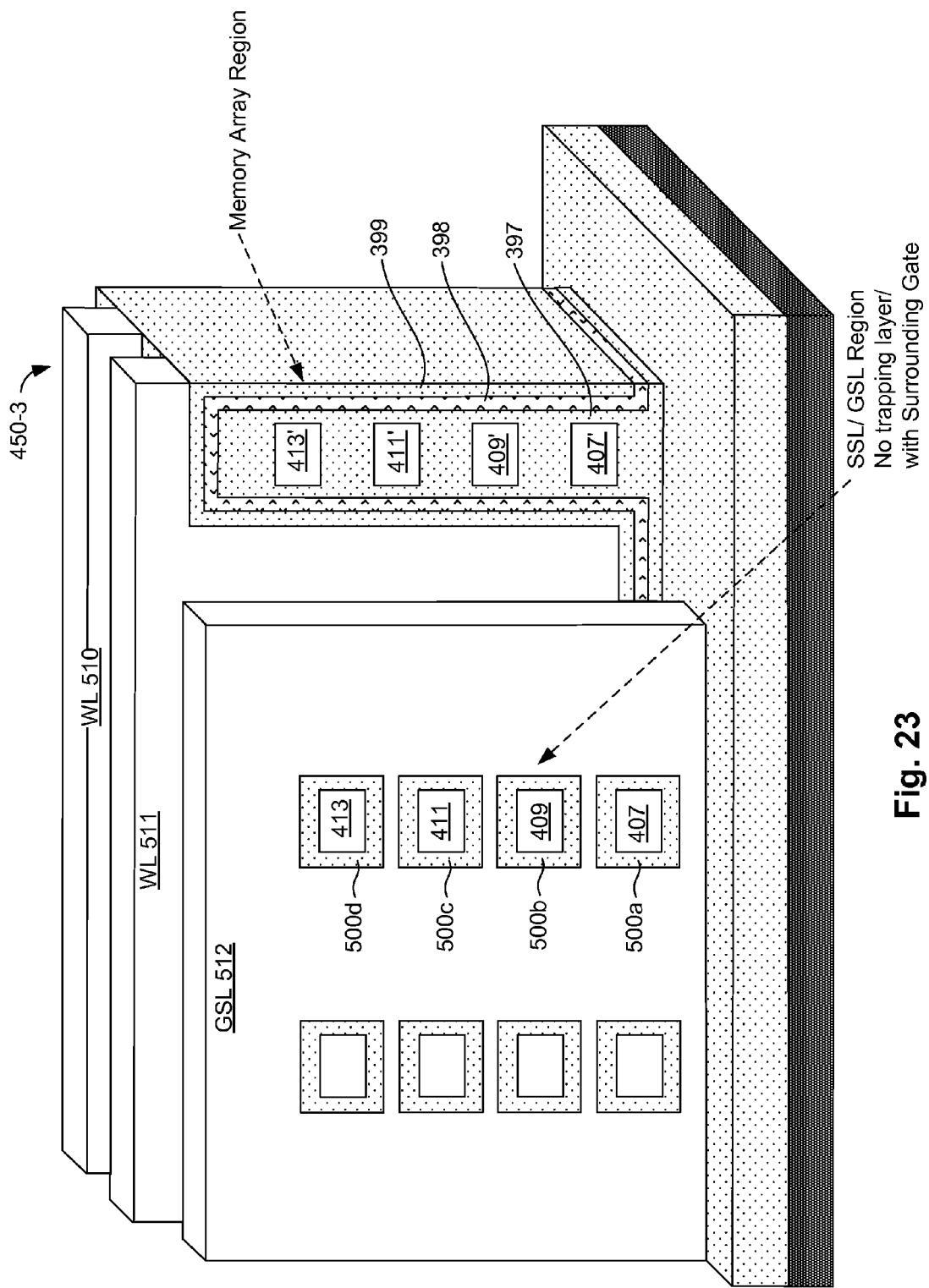

FIG. 23 provides a cutaway view of the structure of FIG. 22, cutting away the GSL switch portion of the stack 450-3, to reveal the memory cell structure in the memory array region. As illustrated, while the GSL switches have surrounding gate structures, the memory cells comprise multilayer charge trapping structures (397, 398, 399) on the side walls of the strips 407', 409', 411' and 413'.

The process as modified according to FIGS. 20-23 is one method to form a memory device comprising a 3D array of memory cells that comprise double-gate thin film transistors having dielectric charge trapping structures in stacks of NAND strings, with a plurality of switch transistors coupled to the NAND strings that comprise surrounding gate transistors.

Surrounding gate transistors can improve the conductivity of the switch during operation, reducing power consumption and improving speed. In examples that are configured as NAND flash, surrounding gate SSL and GSL switch transistors can improve performance for programming operations, such as incremental step pulse programming, that rely upon need self-boosting of unselected strings to inhibit program disturb. In order to have good performance of self-boosting low leakage current is important. Surrounding gate embodiments as described here provide SSL/GSL switches having very low leakage current. For example, surrounding gate transistors can help to reduce the sub-threshold swing SS, thereby reducing leakage.

Figure 24:
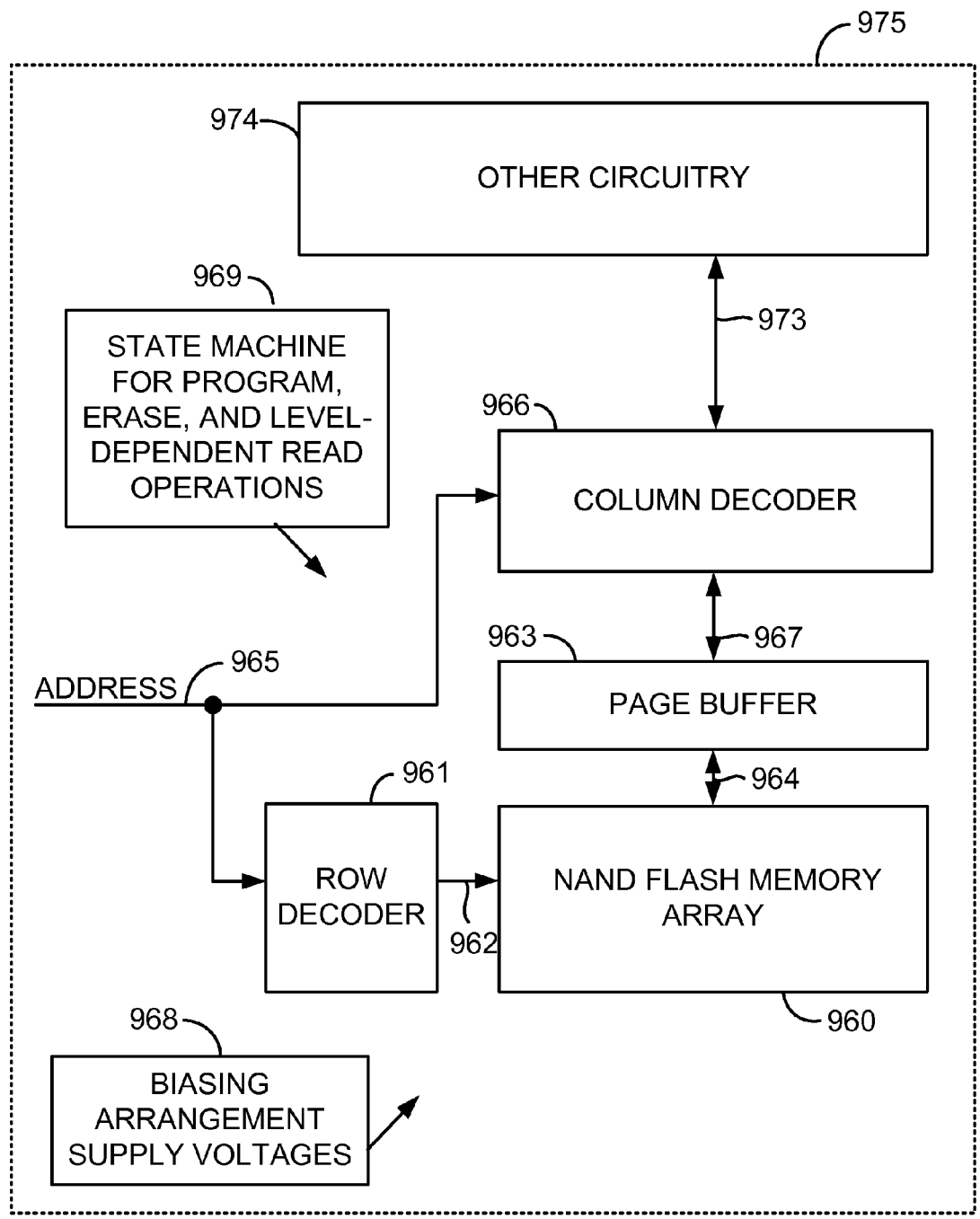
FIG. 24 is a schematic diagram of an integrated circuit including a 3D NAND-flash memory array with modified gate dielectrics for the switch transistors on the strings.

FIG. 24 is a simplified block diagram of an integrated circuit 975 including a NAND flash memory array 960 having gate dielectrics for the switch transistors that are different than the charge trapping structures. In some embodiments, the array 960 can include multiple levels of cells. A row decoder 961 is coupled to a plurality of word lines 962 arranged along rows in the memory array 960. Column decoders in block 966 are coupled to a set of page buffers 963 in this example via data bus 967. The global bit lines 964 are coupled to local bit lines (not shown) arranged along columns in the memory array 960. Addresses are supplied on bus 965 to column decoder (block 966) and row decoder (block 961). Data is supplied via the data-in line 973 from other circuitry 974 (including for example input/output ports) on the integrated circuit, such as a general purpose processor or special purpose application circuitry, or a combination of modules providing system-on-a-chip functionality supported by the array 960. Data is supplied via the line 973 to input/output ports or to other data destinations internal or external to the integrated circuit 975.

A controller, implemented in this example as a state machine 969, provides signals to control the application of bias arrangement supply voltages generated or provided through the voltage supply or supplies in block 968 to carry out the various operations described herein. These operations include erase, program and level-dependent read with different read bias conditions for each level of the array 960. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a 3D array of memory cells including dielectric charge trapping structures, the 3D array including stacks of NAND strings of memory cells; and
    a plurality of switch transistors coupled to the NAND strings, the switch transistors including gate dielectric structures wherein the gate dielectric structures are different than the dielectric charge trapping structures,
    wherein the dielectric charge trapping structures comprise a tunneling layer, a charge trapping layer and blocking layer, and the gate dielectric structure includes an oxide layer including results of oxidation in the presence of the tunneling layer, without the charge trapping layer and the blocking layer, such that a ratio d2/d1 of the thickness d2 of the oxide layer over a beginning level of the switch transistor channel, to the thickness d1 of the oxide layer below the beginning level is greater than 55/45.

2. The device of claim 1, wherein the switch transistors include string select transistors on one end of the NAND strings and ground select transistors coupled to another end of the NAND strings.

3. The device of claim 1, wherein the oxide layer includes a single layer of silicon oxide or silicon oxynitride.

4. A memory device, comprising:
    a plurality of stacks of semiconductor material strips, the plurality of stacks being ridge-shaped and including at least two semiconductor material strips separated by insulating material into different levels of a plurality of levels, the plurality of stacks of semiconductor material strips having first and second ends;
    a plurality of word lines arranged orthogonally over the plurality of stacks, such that a 3D array of interface regions is established at cross-points between surfaces of the plurality of stacks and the plurality of word lines;
    dielectric charge trapping structures including a plurality of dielectric layers in the interface regions, which establish a 3D array of memory cells accessible via the plurality of semiconductor material strips and the plurality of word lines;
    source side and drain side bias structures, including conductors coupled to the first and second ends of the plurality of stacks;
    at least one select line arranged orthogonally over the plurality of stacks, disposed between the plurality of word lines and one of the first and second ends, and gate dielectric structures disposed between the select line and the semiconductor material strips in the plurality of stacks, such that switch transistors are established between the conductors of a corresponding one of the source side and drain side bias structures, and the semiconductor strips in the plurality of stacks; wherein
    the gate dielectric structures are different than the dielectric charge trapping structures; and
    wherein the dielectric charge trapping structures comprise a tunneling layer, a charge trapping layer and blocking layer, and the gate dielectric structure includes an oxide layer including results of oxidation in the presence of the tunneling layer, without the charge trapping layer and the blocking layer, such that a ratio d2/d1 of the thickness d2 of the oxide layer over a beginning level of the switch transistor channel, to the thickness d1 of the oxide layer below the beginning level is greater than 55/45.

5. The device of claim 4, wherein the at least one select line includes
    a first select line on the first end, and a second select line on the second end, and the gate dielectric structures are disposed between the first and second select lines and the semiconductor material strips in the plurality of stacks, such that switch transistors are established between the conductors of the source side bias structures and the semiconductor strips in the plurality of stacks and between the conductors of the drain side bias structures and the semiconductor strips in the plurality of stacks.

6. The device of claim 4, wherein the conductors included in the drain side bias structures comprise bit lines, and the conductors included in the source side bias structures comprise common source lines.

7. The device of claim 4, wherein the oxide layer includes a single layer of silicon oxide or silicon oxynitride.

* * * * *